US009847266B2

(12) United States Patent
Kim et al.

(10) Patent No.: US 9,847,266 B2
(45) Date of Patent: Dec. 19, 2017

(54) METHOD OF FABRICATING SEMICONDUCTOR DEVICE

(71) Applicants: Tae-Hwa Kim, Hwaseong-Si (KR); Chanhoon Park, Osan-Si (KR); Dongsoo Lee, Hwaseong-Si (KR); Jaehyun Lee, Yongin-Si (KR); Hyung Joo Lee, Hwaseong-Si (KR); Kangmin Jeon, Hwaseong-Si (KR); Kyounghoon Han, Seoul (KR)

(72) Inventors: Tae-Hwa Kim, Hwaseong-Si (KR); Chanhoon Park, Osan-Si (KR); Dongsoo Lee, Hwaseong-Si (KR); Jaehyun Lee, Yongin-Si (KR); Hyung Joo Lee, Hwaseong-Si (KR); Kangmin Jeon, Hwaseong-Si (KR); Kyounghoon Han, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/165,684

(22) Filed: May 26, 2016

(65) Prior Publication Data

US 2016/0379903 A1   Dec. 29, 2016

(30) Foreign Application Priority Data

Jun. 29, 2015   (KR) .................. 10-2015-0092375

(51) Int. Cl.
*H01L 21/00*   (2006.01)
*H01L 21/66*   (2006.01)
(Continued)

(52) U.S. Cl.
CPC ........ *H01L 22/26* (2013.01); *H01J 37/32963* (2013.01); *H01L 21/28008* (2013.01);
(Continued)

(58) Field of Classification Search
CPC ............... H01L 22/26; H01L 21/28008; H01L 21/31116; H01L 21/32132; H01L 27/11556; H01L 27/11582
See application file for complete search history.

(56) References Cited

U.S. PATENT DOCUMENTS 5,907,774 A * 5/1999 Wise ................ H01L 27/10817
257/E21.012
6,081,334 A   6/2000 Grimbergen et al.
(Continued)

FOREIGN PATENT DOCUMENTS

JP   H08148474 A   6/1996
JP   2001059193 A   3/2001
(Continued)

*Primary Examiner* — Dale E Page
*Assistant Examiner* — Quovaunda V Jefferson
(74) *Attorney, Agent, or Firm* — Volentine & Whitt, PLLC

(57) ABSTRACT

A method of fabricating a semiconductor device includes etching a stack of first-material layers and second-material layers alternately disposed one on another on a substrate. An upper portion of the stack is etched using an end point detection (EPD) signal of an etching reaction gas, and a function of an injection time of an etchant with respect to a depth of an opening is obtained while the upper portion of the stack is etched. A lower portion of the stack is etched using the obtained function.

11 Claims, 23 Drawing Sheets

(51) Int. Cl.
*H01L 27/11582* (2017.01)
*H01L 21/28* (2006.01)
*H01L 21/3213* (2006.01)
*H01L 21/311* (2006.01)
*H01J 37/32* (2006.01)
*H01L 27/11556* (2017.01)

(52) U.S. Cl.
CPC .. *H01L 21/31116* (2013.01); *H01L 21/32135* (2013.01); *H01L 27/11582* (2013.01); *H01J 2237/334* (2013.01); *H01L 22/12* (2013.01); *H01L 27/11556* (2013.01)

(56) References Cited

U.S. PATENT DOCUMENTS

| | | | |
|---|---|---|---|
| 6,106,662 A | 8/2000 | Bibby, Jr. et al. | |
| 6,276,987 B1 | 8/2001 | Li et al. | |
| 6,765,283 B2 | 7/2004 | Umemoto | |
| 6,908,846 B2 | 6/2005 | McMillin et al. | |
| 6,982,175 B2 | 1/2006 | Johnson et al. | |
| 7,135,410 B2 | 11/2006 | Jacobs et al. | |
| 7,531,369 B2 | 5/2009 | Venugopal | |
| 7,614,932 B2 | 11/2009 | Finarov | |
| 7,751,046 B2 | 7/2010 | Levy et al. | |
| 8,366,953 B2 | 2/2013 | Kohno et al. | |
| 8,491,805 B2 | 7/2013 | Kushibiki et al. | |
| 8,538,572 B2 | 9/2013 | Wang et al. | |
| 8,580,077 B2 | 11/2013 | Ogasawara et al. | |
| 8,598,040 B2 | 12/2013 | Le Gouil et al. | |
| 8,906,810 B2 | 12/2014 | Indrakanti et al. | |
| 2010/0087017 A1* | 4/2010 | Masuoka | H01L 22/26 438/9 |
| 2013/0023127 A1 | 1/2013 | Chang et al. | |

FOREIGN PATENT DOCUMENTS

| | | | |
|---|---|---|---|
| JP | 2003-249483 | * | 9/2003 |
| JP | 2003249483 A | | 9/2003 |
| JP | 2006100672 A | | 4/2006 |
| JP | 2012083521 A | | 4/2012 |
| KR | 20000014109 A | | 3/2000 |
| KR | 20030095983 A | | 12/2003 |
| KR | 20040083845 A | | 10/2004 |

* cited by examiner

METHOD OF FABRICATING SEMICONDUCTOR DEVICE

PRIORITY STATEMENT

This U.S. non-provisional patent application claims priority under 35 U.S.C. §119 to Korean Patent Application No. 10-2015-0092375, filed on Jun. 29, 2015, in the Korean Intellectual Property Office, the disclosure of which is hereby incorporated by reference in its entirety.

BACKGROUND

The inventive concepts relate to methods of fabricating a semiconductor device such as a 3D semiconductor device having a three-dimensional array of memory cells. More particularly, the inventive concepts relate to methods of fabricating a semiconductor device, which include etching a stack of layers.

Semiconductor devices are widely used in the electronics industry because of their small size, multi-functional characteristics and/or low fabrication costs. However, there is an ongoing demand for semiconductor devices that are more highly integrated. To meet such demands, for example, widths and/or spaces of patterns of semiconductor devices are being reduced while the heights and/or aspect ratios of the patterns are being increased. The fabricating of such patterns in the manufacture of more highly integrated semiconductor devices faces various obstacles. For instance, fine patterns having relatively great heights and/or aspect ratios are typically formed by depositing thin layers one another and etching the resultant stack of layers.

SUMMARY

In one aspect, there is provided a method of fabricating a semiconductor device including forming a stack structure including first-material layers and second-material layers alternately disposed one on another on a substrate, forming a mask pattern on the stack structure, a first process of etching an upper portion the stack structure using the mask pattern as an etch mask to form an opening through the upper portion of the stack structure and which process comprises etching respective ones of the first- and second-material layers with first and second etchants, respectively, generating end point detection (EPD) signals by monitoring first and second etching reaction gases resulting from the etching of said respective ones of the first- and second-material layers, determining end points of the etching of said respective ones of the first- and second-material layers with the first and second etchants from the end point detection (EPD) signals, and using the end points to discern a first set of etch recipes under which said respective ones of the first- and second-material layers have been etched, deriving first and second functions of injection times of the first and second etchants, respectively, each with respect to a depth of the opening during the first process and a second process of etching a lower portion of the stack structure using the mask pattern as an etch mask to extend the opening in the upper portion of the stack structure through a lower portion of the stack structure and thereby expose the substrate. The second process comprises creating a second set of etch recipes based on the first and second functions of injection times of the first and second etchants, respectively, and etching respective ones of the first- and second-material layers in a lower portion of the stack structure under the second set of etch recipes. Accordingly, the etch recipes of the first set under which the first- and second-material layers of the lower portion of the stack structure are etched are respectively different from the etch recipes of the second set under which the first and second-material layers of the upper portion of the stack structure are etched.

In another aspect, a method of fabricating a semiconductor device includes forming a stack structure including first-material layers and second-material layers alternately stacked on a substrate, the first-material layers to be etched by a first etchant, and the second-material layers to be etched by a second etchant, forming a mask pattern on the stack structure, etching an upper portion of the stack structure using the mask pattern as an etch mask by a first process to form an opening, etching an intermediate portion of the stack structure using the mask pattern as an etch mask by a second process to extend the opening, and etching a lower portion of the stack structure using the mask pattern as an etch mask by a third process to further extend the opening to such an extent that the opening exposes the substrate. In each of the first and second processes, recipes of the first and second etchants are changed using first and second end point detection (EPD) signals representative of amounts of first and second etching reaction gases produced as a result of the first and second processes, respectively, to etch the first and second-material layers of each of the upper and intermediate portions. Functions of the recipes of the first and second etchants with respect to the depth of the opening are obtained during the first and second processes. In the second process, the recipes of the first and second etchants are changed using the functions obtained during the first and second processes to etch the first and second-material layers of the lower portion.

In another aspect, a method of fabricating a semiconductor device includes alternately forming first and second layers of material one above another on a substrate to thereby form a stack of the first and second layers on the substrate such that the first layers are all formed of a first material and the second layers are all formed of a second material having an etch selectivity with respect to the first material, forming a mask on the stack structure, wherein the mask has an opening that exposes an upper surface of the stack, etching upper ones of the first and second layers using first and second wet etchants, respectively, with the mask disposed on the stack to thereby form an opening in an upper portion of the stack, determining respective amounts of time it took to etch each away each of said upper ones of the first and second layers using the first and second wet etchants, respectively, analyzing the amounts of time, and further extending the opening through the stack of the first and second layers by etching a lower portion of the stack.

BRIEF DESCRIPTION OF THE DRAWINGS

The inventive concepts will become more apparent in view of the attached drawings and accompanying detailed description.

DETAILED DESCRIPTION

Figure 1A:
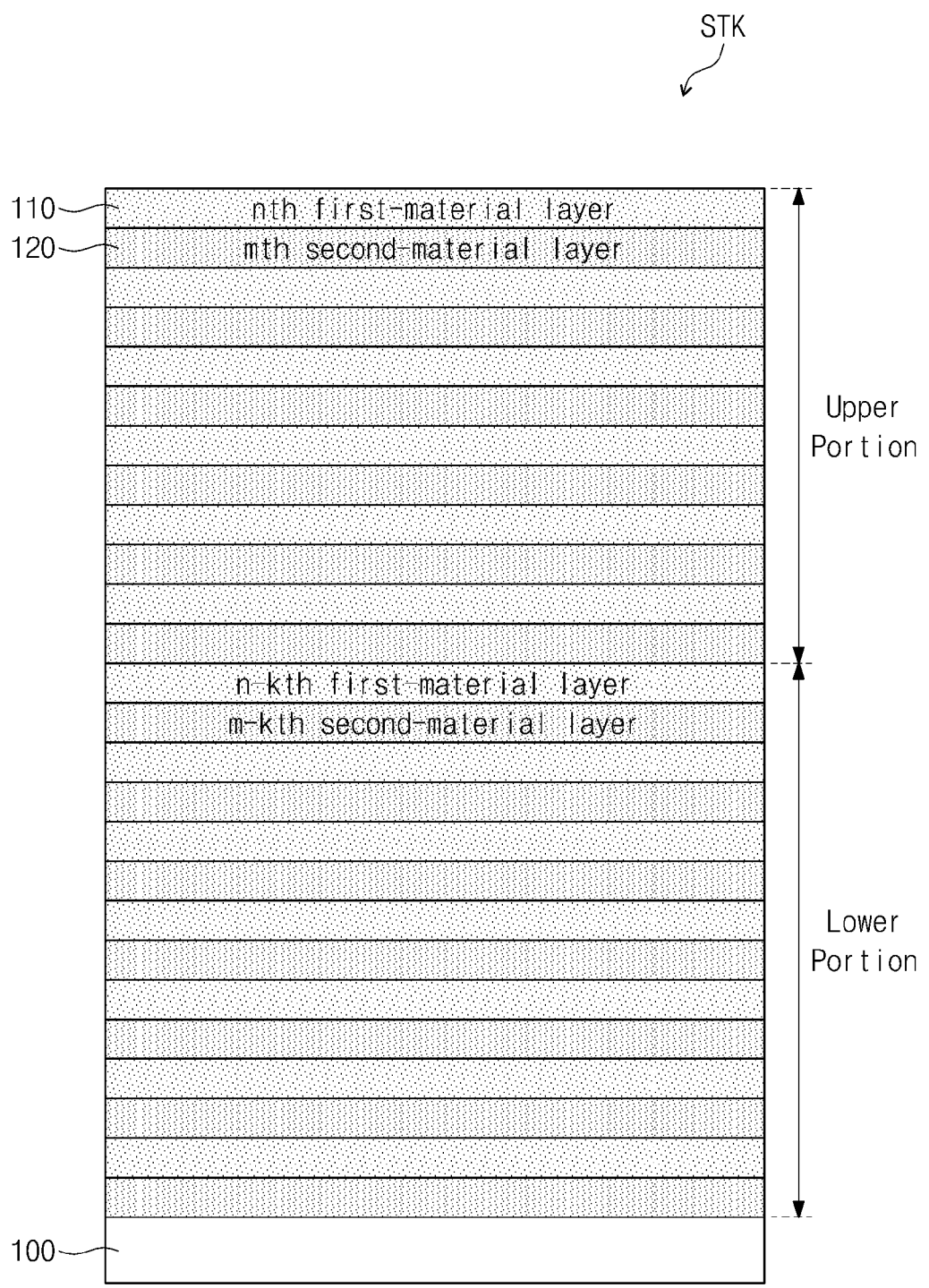
FIGS. 1A, 1B, 1C, 1D, 1E AND 1F are cross-sectional views of a semiconductor device during the course of its manufacture and together illustrate an example of a method of fabricating the semiconductor device according to the inventive concepts.

The advantages and features of the inventive concepts and methods of achieving them will be apparent from the following exemplary examples that will be described in more detail with reference to the accompanying drawings. It should be noted, however, that the inventive concepts are not limited to the following examples, and may be implemented in various forms. Accordingly, the examples are provided only to disclose the inventive concepts and let those skilled in the art know the category of the inventive concepts. The inventive concepts are not limited to the specific examples disclosed herein and in the drawings, various aspects and features of the inventive concepts are exaggerated for clarity.

It will be understood that when an element such as a layer, region or substrate is referred to as being "on" another element, it can be directly on the other element or intervening elements may be present. In contrast, the term "directly" means that there are no intervening elements. In the drawings, the thicknesses of layers and regions are exaggerated for clarity.

The disclosed examples of the inventive concepts are described herein with reference to cross-sectional illustrations and/or plan illustrations that are idealized exemplary illustrations. Accordingly, variations from the shapes of the illustrations as a result, for example, of manufacturing techniques and/or tolerances, are to be expected. Thus, the inventive concepts should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of the inventive concepts. It will be also understood that although the terms first, second, third etc. may be used herein to describe various elements, these elements should not be limited by these terms. These terms are only used to distinguish one element from another element. Thus, a first element in some examples could be termed a second element in other examples without departing from the teachings of the present invention. Aspects of the present inventive concepts explained and illustrated herein include their complementary counterparts. The same reference numerals or the same reference designators denote the same elements throughout the drawings.

The terminology used herein is for the purpose of describing particular examples only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. The term "injecting" will be understood as referring to the injecting of a gaseous etchant into a process (etch) chamber at some given rate in standard units (e.g. sccm). Also, the term "etchant" will be understood as inclusive of both the active gas (eth gas) and any inactive gas (e.g., an inert carrier gas). Therefore, amounts of an etchant will generally be understood as referring to volume or volumetric amounts.

Hereinafter, examples of the inventive concepts will be described in detail hereinafter with reference to the accompanying drawings.

Figure 2:
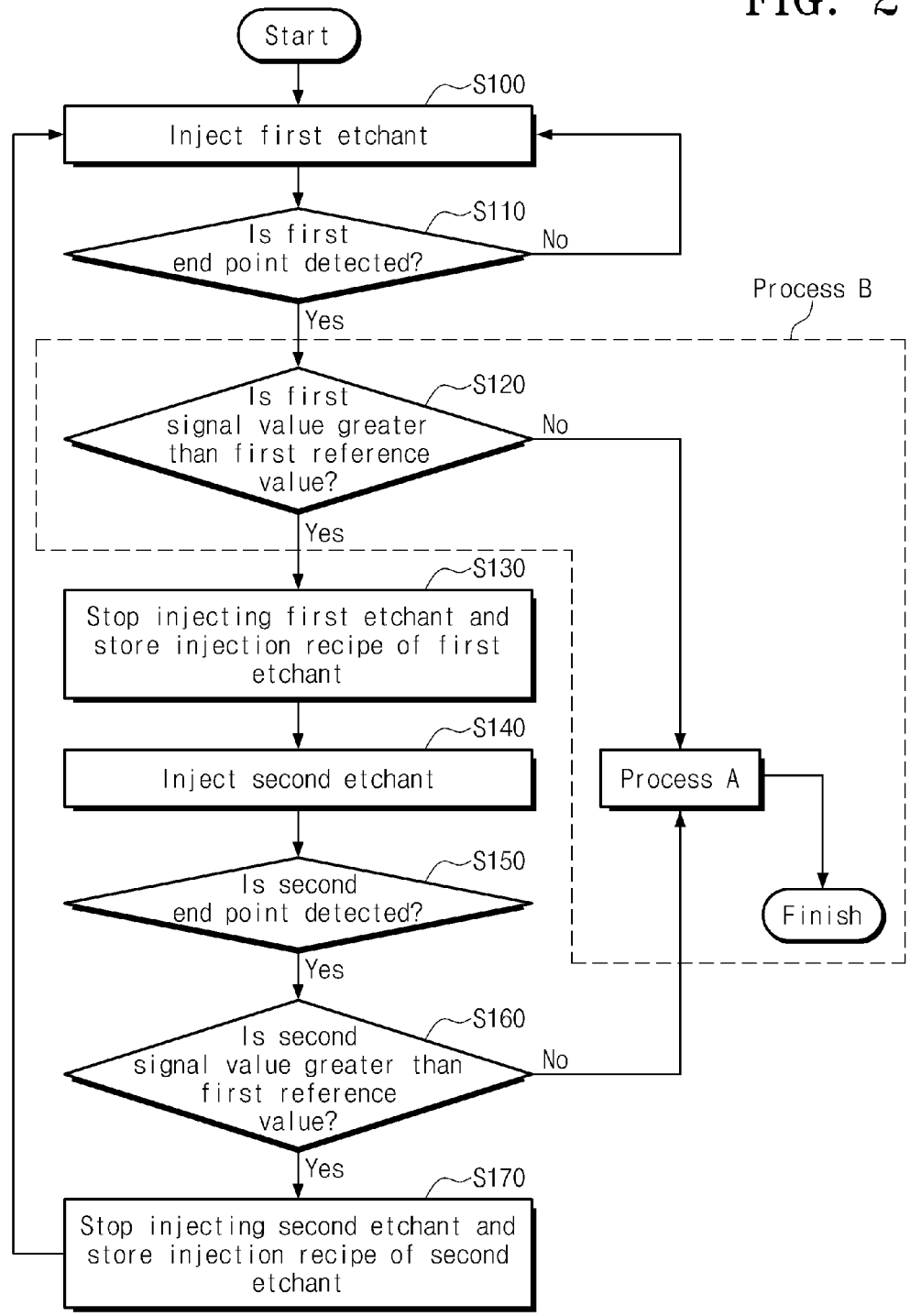
FIG. 2 is a flow chart of a method of fabricating a semiconductor device according to the inventive concepts.
Figure 3:
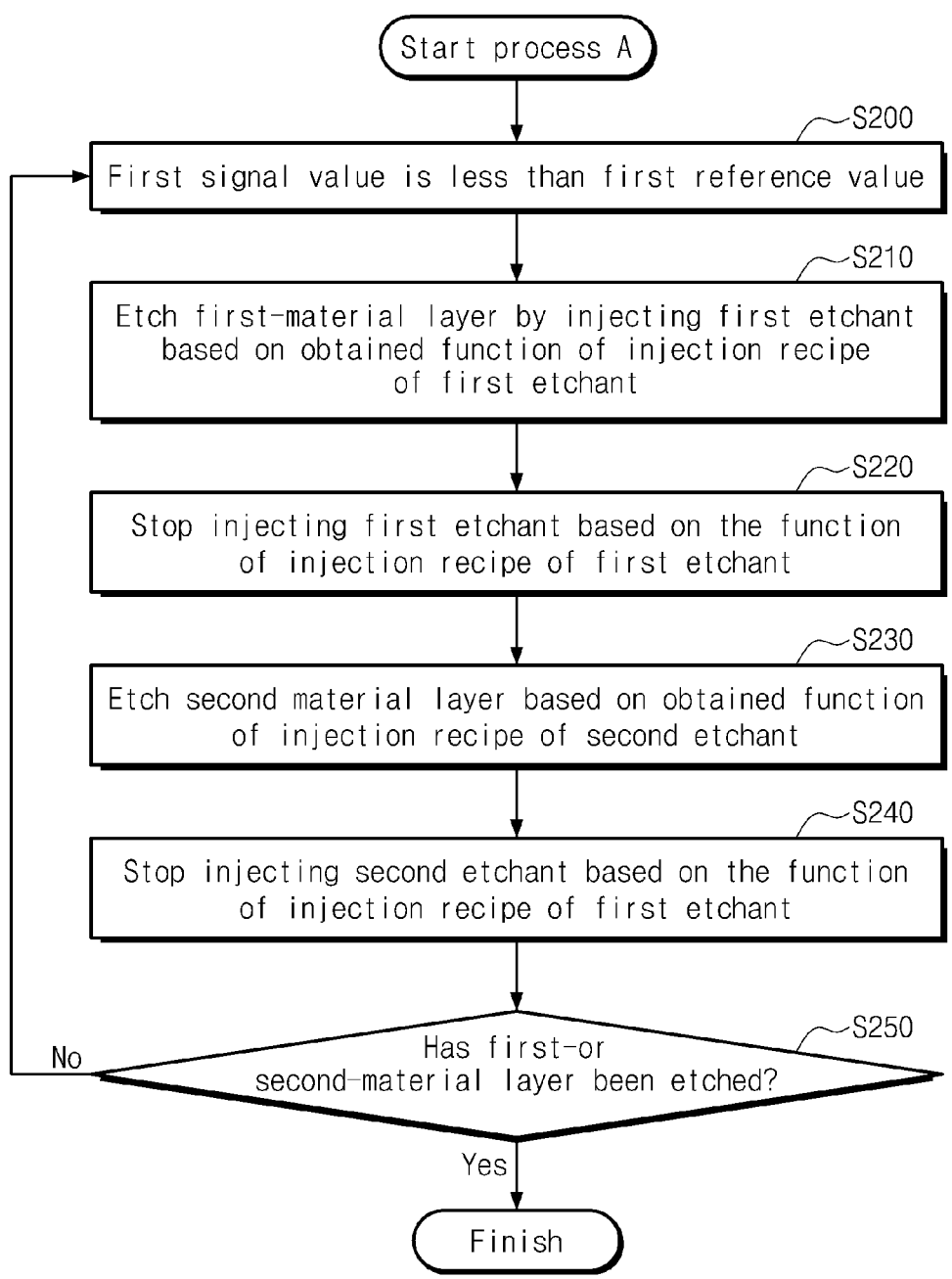
FIG. 3 is a flow chart of a sub-routine of the method of FIG. 2.

FIGS. 1A through 1F illustrate one example of a method of fabricating a semiconductor device according to the inventive concepts. FIGS. 2 and 3 are flow charts illustrating the method.

Referring to FIG. 1A, a plurality of first-material layers 110 and a plurality of second-material layers 120 may be alternately stacked on a substrate 100 to form a stack structure STK.

The number of the first-material layers 110 stacked on the substrate 100 may be n, i.e., n is a positive integer greater than 1, and the number of the second-material layers 120 stacked on the substrate 100 may be m, i.e., m is a positive integer greater than 1 and equal to n in this example. Thicknesses of the first-material layers 110 may be equal to each other, such that each of the first-material layers 110 may have a first thickness. Likewise, thicknesses of the second-material layers 120 may be equal to each other, such that each of the second-material layers 120 may have a second thickness.

According to an example of the inventive concepts, the first-material layer 110 may be etched by a first etchant, and the second-material layer 120 may be etched by a second etchant. In addition, the first-material layer 110 may not be substantially etchable by the second etchant, and the second-material layer 120 may not be substantially etchable by first etchant. The first and second etchants may include etching gases capable of substantially etching the first-material layer 110 and the second-material layer 120, respectively, and a carrier gas.

According to an example, the first-material layer 110 includes an oxide layer such as a silicon oxide layer, and the first etchant includes a $C_xF_y$-based etching gas. The second-material layer 120 includes a nitride layer such as a silicon nitride layer, and the second etchant includes a $C_xH_yF_z$-based etching gas.

The stack structure STK includes an upper portion and a lower portion. According to an example, the lower portion of the stack structure STK may include a first first-material layer 110 to an $n-k^{th}$ first-material layer 110 and a first second-material layer 120 to an $m-k^{th}$ second-material layer 120. The upper portion of the stack structure STK may include an $n-k+1^{th}$ first-material layer 110 to an $n^{th}$ first-material layer 110 and an $m-k+1^{th}$ second-material layer 120 to an $m^{th}$ second-material layer 120. In this example, "k"

is less than "n" (and "m") and greater than 1 (n>k>1), and each of "n", "m" and "k" is a positive integer. Sections of the upper and lower portions of the stack structure STK may be changed according to an etching process.

Figure 1B:
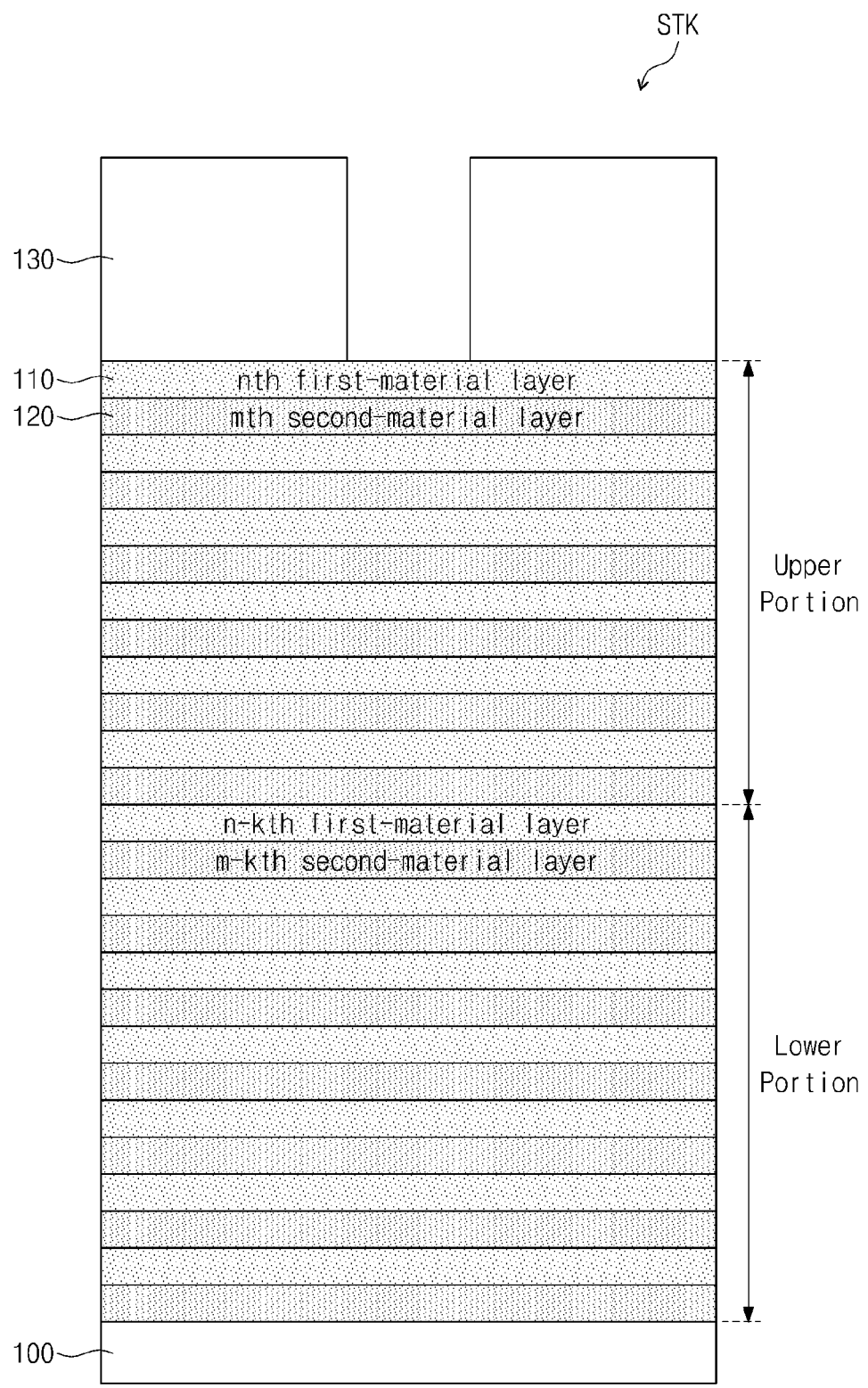

Referring to FIG. 1B, a mask pattern 130 may be formed on the stack structure STK. The mask pattern 130 may expose a top surface of a portion, to be etched, of the stack structure STK.

The mask pattern 130 may include a material that is not substantially etched by the first and second etchants. For example, the mask pattern 130 may include a resist (e.g., a photoresist).

Figure 1C:
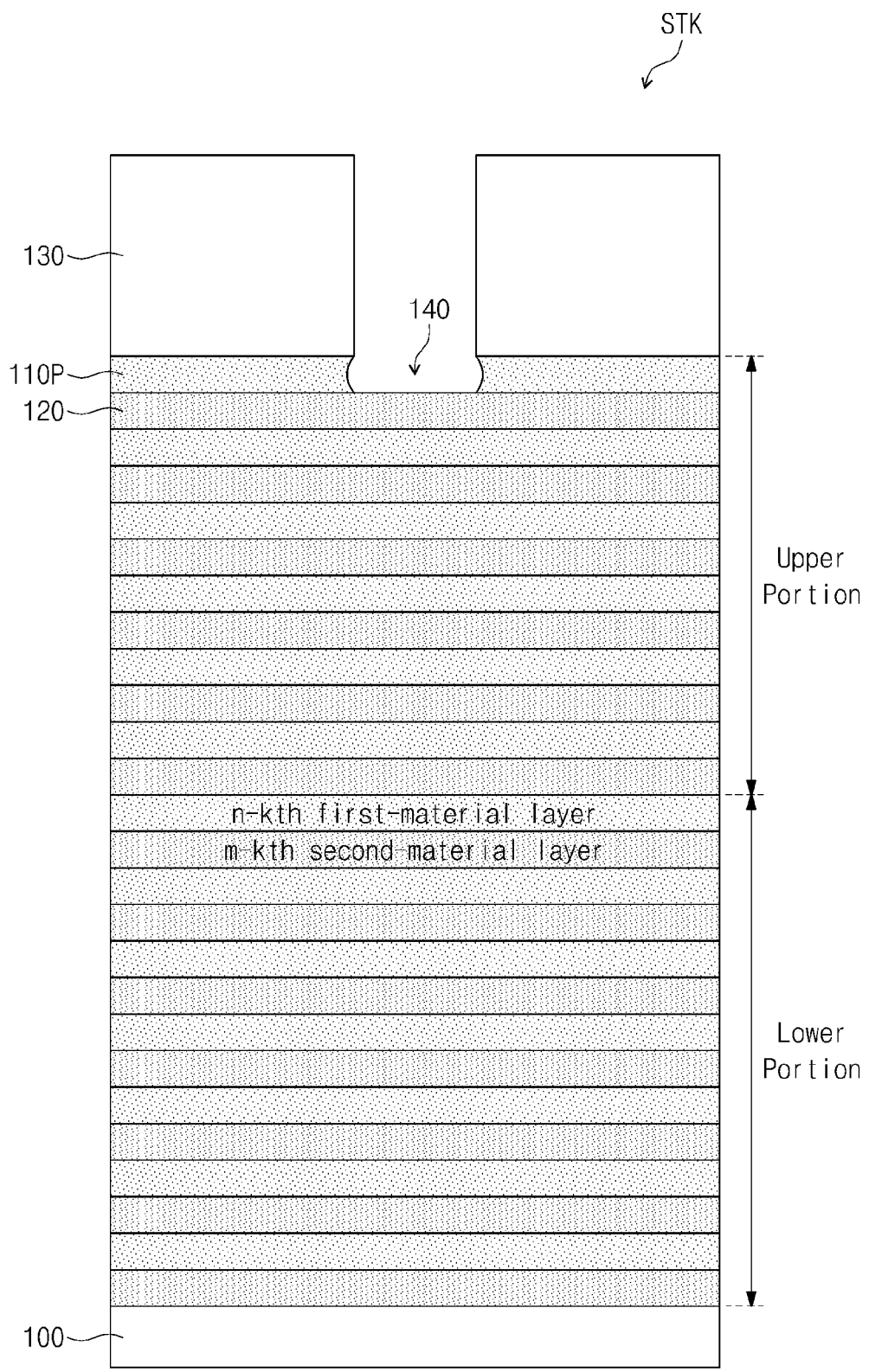

Referring to FIGS. 1C and 2, the $n^{th}$ first-material layer 110 may be etched using the mask pattern 130 as an etch mask by the first etchant to form an $n^{th}$ first-pattern 110P (S100). In an example in which the first-material layer 110 is a silicon oxide layer and the first etchant includes $C_xF_y$, a first etching reaction gas occurring by etching the first-material layer 110 includes $C_xO_y$.

According to an example of the inventive concepts, a first end point may be detected to stop etching the first-material layer 110 (S110). A method of detecting the first end point may include an optical emission spectroscope method, a method using an interference phenomenon, and/or a method of detecting a voltage and a current of a radio-frequency (RF) wave generated in a RF generating system. The optical emission spectroscope method will described as the method of detecting the first end point for exemplifying the inventive concepts only. That is, the inventive concepts are not limited to an optical emission spectroscope as the method of detecting the first end point.

The first-material layer 110 may be etched by the first etchant, and the first etching reaction gas may be exhausted as by-products of the reaction. The optical emission spectroscope method of detecting the first end point monitors the quantity of the first etching reaction gas over time and produces in the form of an end point detection (EPD) signal of the first etching reaction gas (first end point detection (EPD) signal). The first EPD detection signal may gradually increase from a first start point to a first peak and then may gradually decrease. The first end point may be deemed, for example, to be a point in time corresponding to 90% of the first peak after the first peak. At the first end point, injection of the first etchant is interrupted, and preparations may be made for injecting the second etchant for etching the $m^{th}$ second-material layer 120.

At this time, a difference between a magnitude of the first start point and a magnitude of the first peak in the first EPD signal is defined as a first signal value. The first signal values may gradually decrease as the first-material layers 110 of the stack structure STK are sequentially etched.

An opening 140 partially exposing a top surface of the $m^{th}$ second-material layer 120 may be formed by the etching process of the $n^{th}$ first-material layer 110. The opening 140 may become deeper as etching processes of the stack structure are sequentially performed. According to an example, an inner side surface of the $n^{th}$ first-pattern 110P exposed by the opening 140 may have a curved profile which is concave from the opening 140 toward the $n^{th}$ first-pattern 110P.

According to an example of the inventive concepts, an injection recipe of the first etchant for etching the $n^{th}$ first-material layer 110 may be stored (S130). For example, the recipe of the first etchant may include an injection time of the first etchant, an injection amount of the first etchant, and a ratio of the etching gas to the carrier gas in the first etchant. The recipes of the first etchant which respectively correspond to the first-material layers 110 of the stack structure STK may be continuously stored, and a trend of the recipe of the first etchant with respect to a depth of the opening 140 may be obtained. For example, the injection times of the first etchant may gradually increase as the first-material layers 110 are sequentially etched. Thus, and in addition, a function of the injection time of the first etchant with respect to the depth of the opening 140 may be obtained.

Figure 1D:
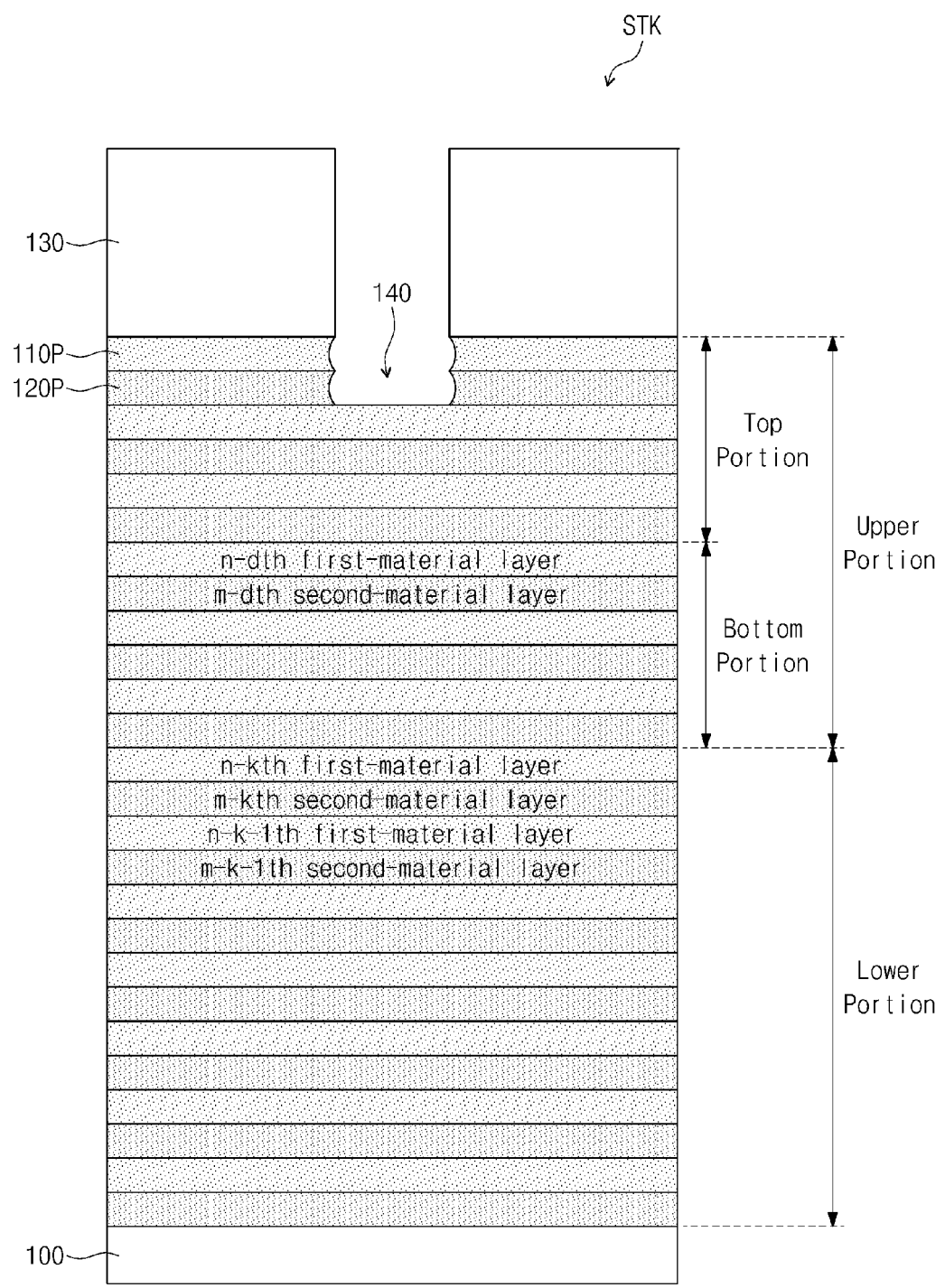
Figure 1E:
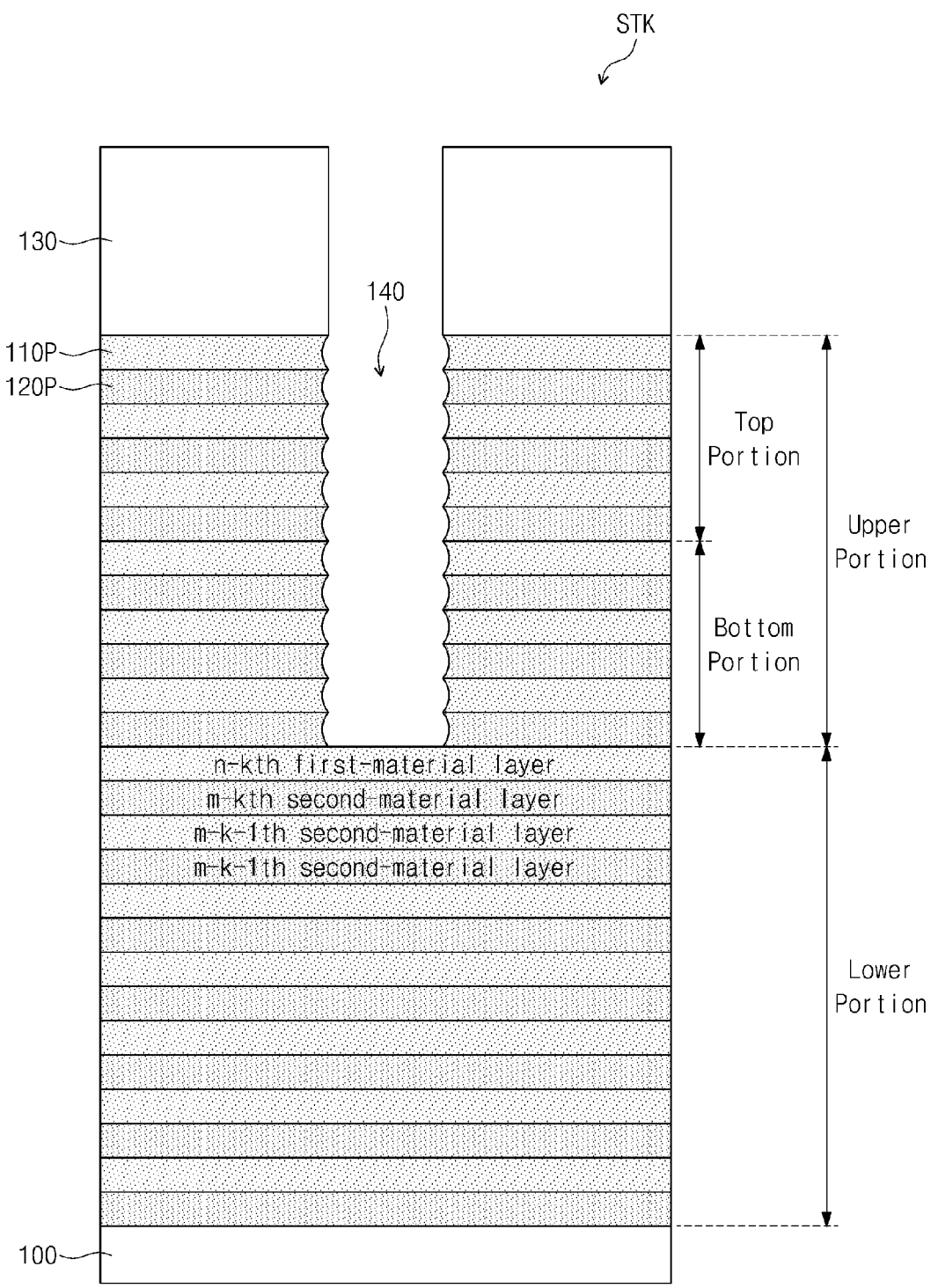

Referring to FIG. 1D, the $m^{th}$ second-material layer 120 may be etched using the mask pattern 130 as an etch mask by means of the second etchant (S140) to form an $m^{th}$ second-pattern 120P. According to an example in which the second-material layer 120 is a silicon nitride layer and the second etchant includes $C_xH_yF_z$, a second etching reaction gas created as a result of the etching of the second-material layer 120 includes $C_xN_y$.

According to an example of the inventive concepts, a second end point may be detected, at which time the etching of the second-material layer 120 is stopped (S150). The second-material layer 120 may be etched by the second etchant, and the second etching reaction gas may be exhausted as by-products of the reaction. The amount of the second etching reaction gas produced over time may be monitored in the form of an end point detection (EPD) signal (second EPD signal), and the second end point may be detected using the second EPD signal. For example, the EPD signal of the second etching reaction gas (second EPD signal) may gradually increase from a start point (referred to hereinafter as the "second star point") to a peak (referred to hereinafter as the "second peak") and then may be gradually decrease. The second end point may be deemed to be the point in time corresponding to 90% of the second peak after the second peak. At the second end point, injection of the second etchant is interrupted, and preparations may be made for injecting the first etchant for etching an $n-1^{th}$ first-material layer 110.

At this time, a difference between a magnitude of the second start point and a magnitude of the second peak in the second EPD signal is defined as a second signal value. The second signal values may gradually decrease as the second-material layers 120 of the stack structure STK are sequentially etched.

The opening 140 may become deeper by the etching process of the $m^{th}$ second-material layer 120, and the opening 140 may partially expose a top surface of the $n-1^{th}$ first-material layer 110. According to an example, an inner side surface of the $m^{th}$ second-pattern 120P exposed by the opening 140 may have a curved profile which is concave from the opening 140 toward the $m^{th}$ second-pattern 120P.

According to an example of the inventive concepts, an injection recipe of the second etchant for etching the $m^{th}$ second-material layer 120 may be stored (S170). For example, the recipe of the second etchant may include an injection time of the second etchant, an injection amount of the second etchant, and a ratio of the etching gas to the carrier gas in the second etchant. The recipes of the second etchant which respectively correspond to the second-material layers 120 of the stack structure STK may be continuously stored, and a trend of the recipe of the second etchant with respect to the depth of the opening 140 may be obtained. For example, the injection times of the second etchant may gradually increase as the second-material layers 120 are sequentially etched. Thus, a function of the injection time of the second etchant with respect to the depth of the opening 140 may be obtained.

The processes described with reference to FIGS. 1C and 1D may be repeatedly performed to etch the first-material layers 110 and the second-material layers 120 in an order opposite to that in which the first and second-material layers 110 and 120 are formed as stacked one atop another (i.e., in an order from one material layer 110 or 120 proximate the mask pattern 140 of each adjacent pair of the layers to the other material layer 110 or 120 remote from the mask pattern 140). Thus, first-patterns 110P and second-patterns 120P may be formed.

However, it may not be easy to etch all of the first and second-material layers 110 and 120 of the stack structure STK. In particular, it may be difficult to etch the first and second-material layers 110 and 120 of the lower portion of the stack structure STK by merely continuing to carry out the process described above.

Figure 4:
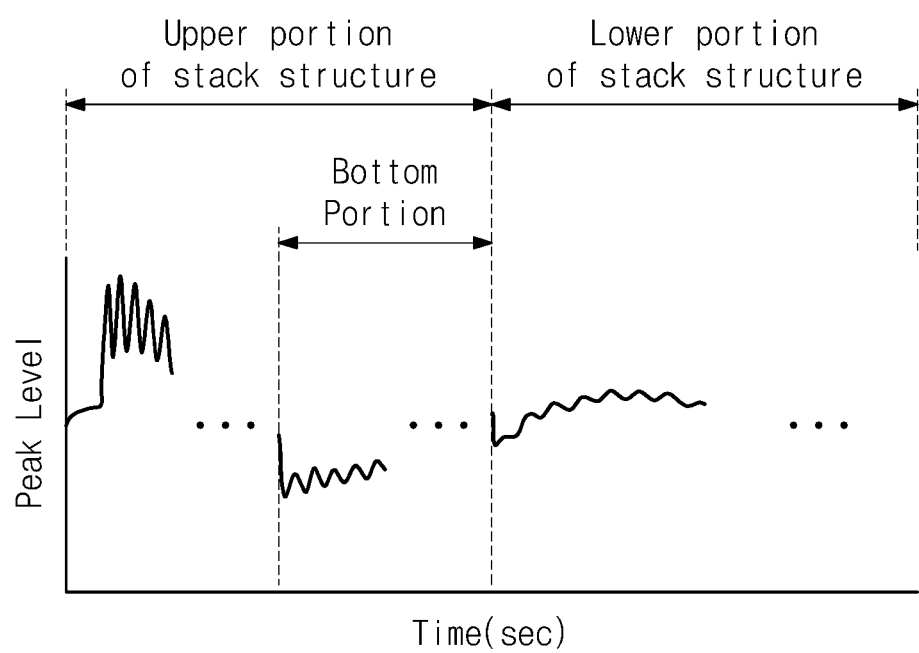
FIG. 4 is a graph of end point detection (EPD) signals (amounts of reactive etching gases detected over time) that may be generated when etching a stack of first- and second-material layers using first and second etchants, respectively.

FIG. 4 is a graph illustrating an end point detection (EPD) signal of a reactive etching gas. Referring to FIG. 4, the magnitudes or values of the first and second signal values may continuously decrease as time passes. As the etching processes are performed, the opening 140 formed in the stack structure STK may become deeper. The first and second etchants may be injected through the opening 140, and the first and second etching reaction gases may be exhausted through the openings 140. As the opening 140 becomes deeper, it may become increasingly difficult to inject the first and second etchants and to exhaust the first and second etching reaction gasses. Thus, the values of the first and second signal may continuously decrease.

If the first and second signal values decrease to zero (0), the first and second-material layers 110 and 120 may not be etched by the processes described with reference to FIGS. 1C and 1D. In particular, at a point in the process at which the values of the first and second signal are not even zero but are close to zero, it may not be easy to subsequently etch respective ones of the first and second-material layers 110 and 120 using the processes described with reference to FIGS. 1C and 1D. Thus, a first reference value greater than zero may be set, and the first and second-material layers 110 and 120 may be etched by other process (see FIGS. 1F and 2) from a time point at which the first and second signal values are less than or equal to the first reference value. The first reference value may be set based on a particular type of process and type of semiconductor device under manufacture.

According to an example of the inventive concepts, each of the first and second signal values may be compared with the first reference value (S120 or S160), thereby determining whether respective ones of the first and second-material layers 110 and 120 have been sufficiently etched by the associated process described with reference to FIG. 1C or 1D.

According to an example, as long as the first and second signal values are greater than the first reference value, the first and second-material layers 110 and 120 are etched by the processes described with reference to FIGS. 1C and 1D. The processes described with reference to FIGS. 1C and 1D may be referred to collecting as "a first process". In other word, the upper portion of the stack structure STK may be etched by the first process. In addition, the first process may be finished at a time at which either of the first and second signal values is less than or equal to the first reference value.

Figure 1F:
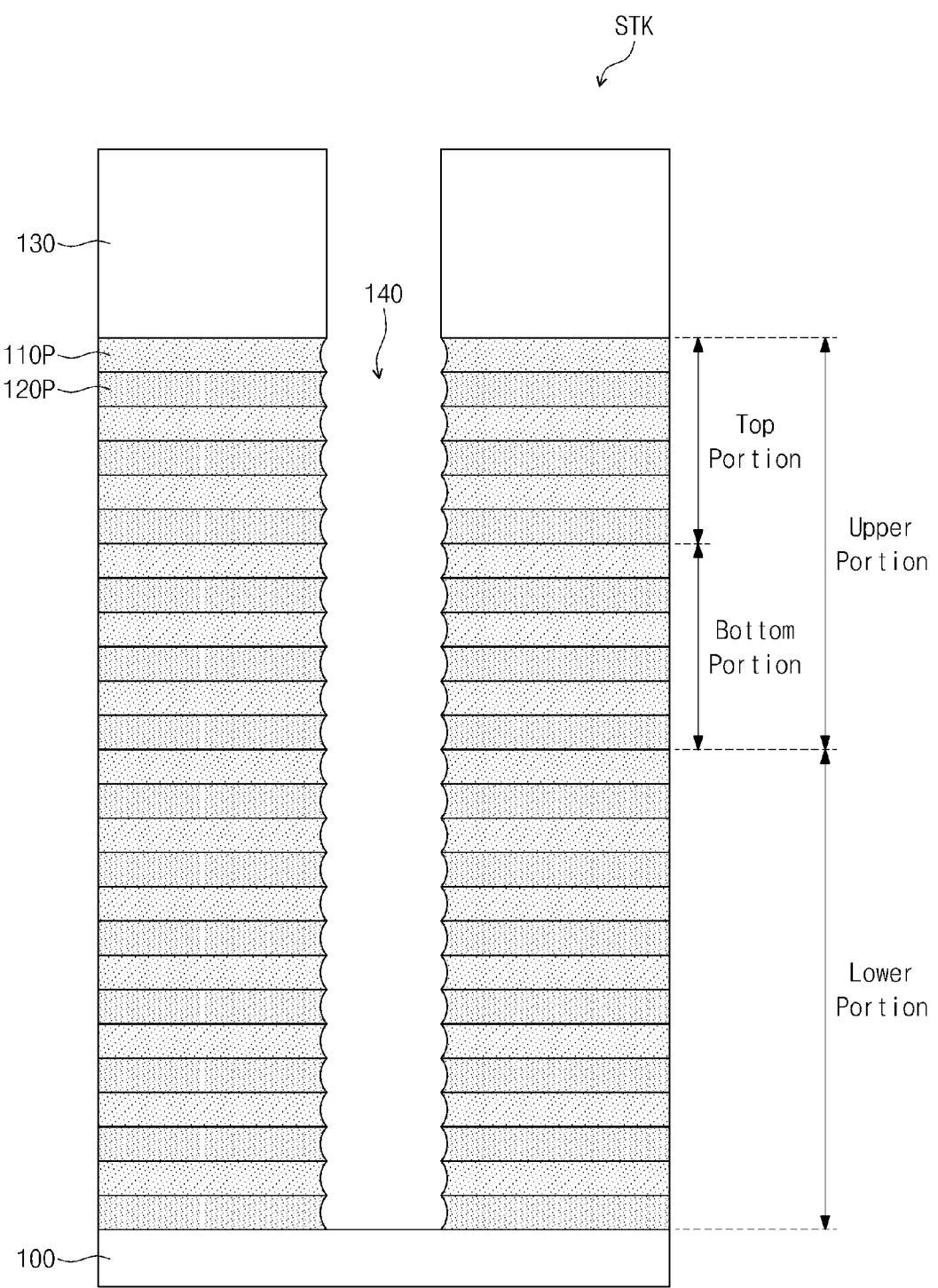

When either of the first and second signal values is less than or equal to the first reference value (in steps S120, S160 and S200) during the process flow, the lower portion of the stack structure STK may be etched by a second process different from the first process used to etch the upper portion of the stack structure STK, as illustrated in FIGS. 1F and 2. The second process is illustrated as 'Process A' in FIG. 2. An example of 'Process A' which may thus be a sub-routine of the method is shown in FIG. 3.

Hereinafter, the process (i.e., the process A) of etching the lower portion of the stack structure STK will be described in more detail.

As described above, while the upper portion of the stack structure STK is etched, the recipes of the first and second etchants may be stored (S130 and S170) and analyzed to determine trends of the recipes of the first and second etchants. In one example, the trends are functions of the injection times of the first and second etchants with respect to the depth of the opening 140. In another example, the trends are functions of the amounts of the first and second etchants injected with respect to the depth of the opening 140. In still another example, the trends are relative amounts of the etching gases in the first and second etchants (e.g., ratio of etching gas to carrier gas) with respect to the depth of the opening 140.

Recipes of the first and second etchants may be changed based on the functions of the injection times of the first and second etchants with respect to the depth of the opening 140 to etch the first and second-material layers 110 and 120 of the lower portion of the stack structure STK, respectively.

Referring to FIGS. 1F and 3, if the first signal value is less than or equal to the first reference value in step S200, the first etchant may be injected using the functions obtained during etching of the upper portion of the stack structure STK to etch the n–k$^{th}$ first-material layer 110 (S210). The injection of the first etchant may be stopped according to the functions (S220) to from an n–k$^{th}$ first-pattern 110P. The second etchant may be injected using the functions to etch the m–k$^{th}$ second-material layer 120 (S230). The injection of the second etchant may be stopped according to the functions (S240) to from an m–k$^{th}$ second-pattern 120P. The process of FIG. 3 may be repeatedly performed until the first first-material layer 110 or the first second-material layer 120 is etched (S250).

As a result of the etching process described with reference to FIGS. 1B through 1F, 2 and 3, the opening 140 may extend completely through the stack structure STK. An inner side surface of the stack structure STK which is exposed by the opening 140 may have the profile of an embossed structure.

Figure 5:
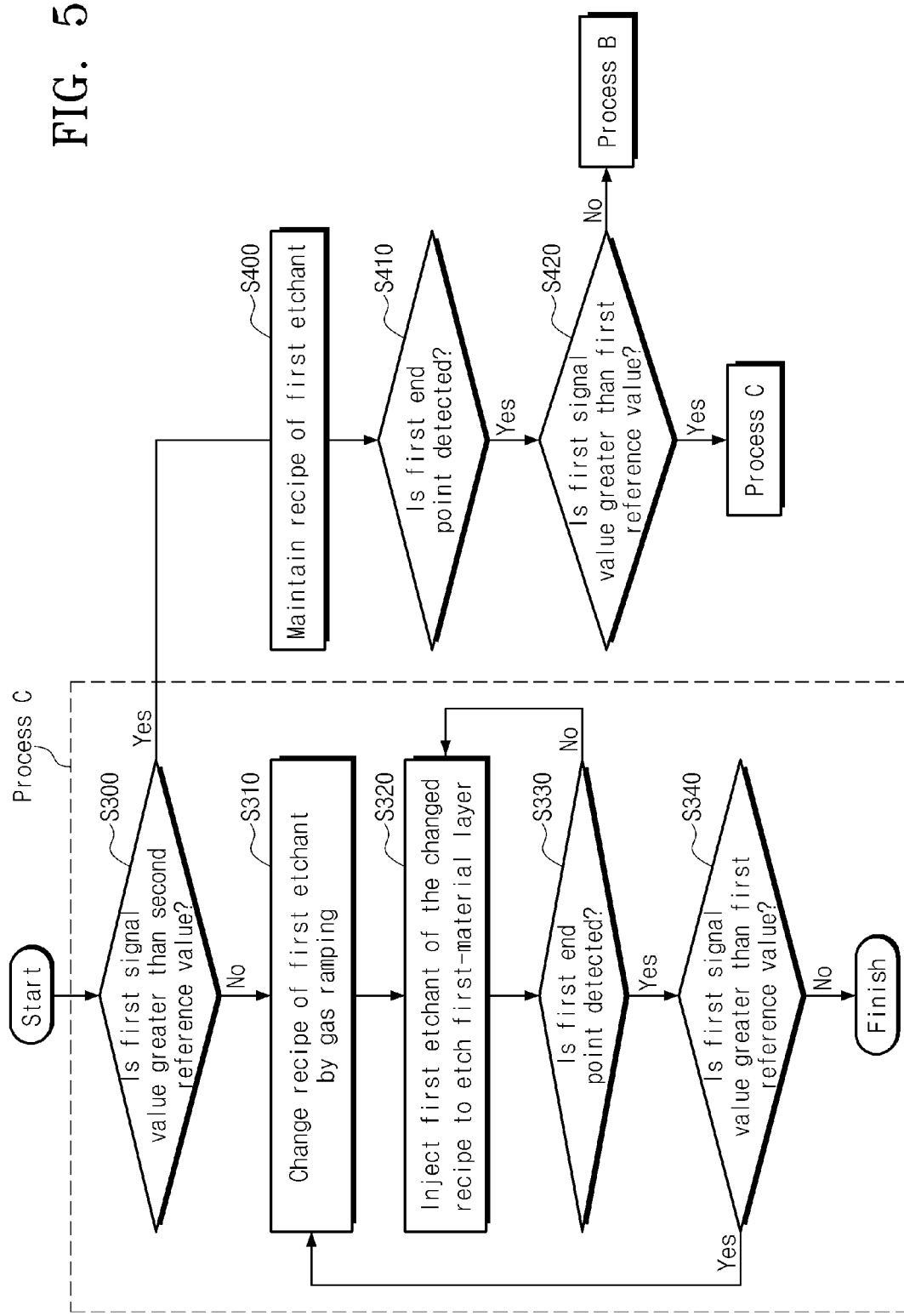
FIG. 5 is a flow chart illustrating another process in a method of fabricating a semiconductor device according to the inventive concepts.

FIG. 5 is a flow chart illustrating another example of a method of fabricating a semiconductor device according to the inventive concepts. Basically, the method of FIG. 5 includes a gas ramping process in addition to those described with reference to the flow charts of FIGS. 2 and 3.

Referring back to FIG. 4, the first and second peaks in the bottom section of the upper portion of the stack structure STK are lower than those in a top section of the upper portion of the stack structure STK, i.e., the maximum values of the EPD signals are greater in the upper portion of the stack structure STK than in the bottom section of the upper portion of the stack structure STK. In addition, as illustrated in FIG. 4, the frequency of the EPD signals (distance between adjacent first and second peaks) in the bottom section of the upper portion of the stack structure STK is less (distance between adjacent peaks is greater) than that in the top section of the upper portion of the stack structure STK. The observed reduction in magnitudes of the first and second peaks evidences that the detected amounts of the first and second etching reaction gases decrease as the depth of the opening 140 of FIG. 1D increases. The observed decrease in frequency means that times during which the first and second etching reaction gases are produced during the etching of a particular material layer increase (before an end point of the etching is detected). The decrease in the detected amounts and the increase in the detection times of the first and second etching reaction gases mean that the distances over which the first and second etchants are traveling to etch targeted ones of the first- and second-material layers 110 and 120 are increasing and that the first and second etchants are being partially or completely consumed at the first- and second-patterns 110P and 120P before they reach the targeted ones of the first- and second-material layers 110 and 120.

In the bottom section of the upper portion of the stack structure STK, the first and second signal values may tend to be greater than the first reference value while the times during which the first and second-material layers 110 and 120 are being etched tend to increase. In consideration of these tendencies, a gas ramping process (FIG. 5 and FIG. 6) may be initiated at some point in time during the etching of the upper portion of the stack structure STK to efficiently etch the first and second-material layers 110 and 120 in the bottom section of the upper portion of the stack structure STK.

Figure 6:
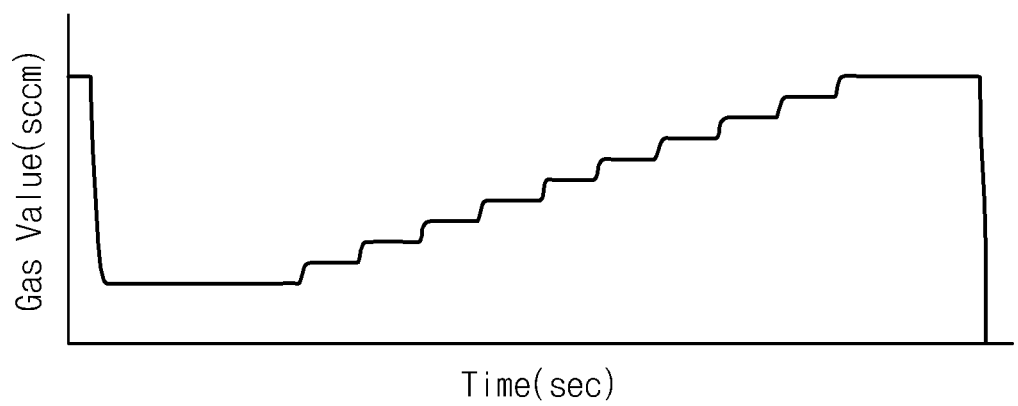
FIG. 6 is a graph illustrating a gas ramping process of FIG. 5.

Referring to FIG. 6, the amounts of the first and second etchants may be increased stepwise as the depth of the opening increases (e.g., as the time of the first process increases), for example. Alternatively, the injection times of the first and second etchants may be increased stepwise, or the ratio of the etching gas to the carrier gas in each of the first and second etchants may be increased stepwise.

Etching an n–$d^{th}$ first-material layer 110 and an n–d–$1^{th}$ first-material layer 110 will be described as an example with reference to FIGS. 1D and 5. If a first end point is detected and a first signal value is greater than the first reference value while the n–$d^{th}$ first-material layer 110 is etched by the first etchant, the first signal value is compared with a second reference value (S300). At this time, the second reference value is greater than the first reference value.

If the first signal value is greater than the second reference value, the n–d–$1^{th}$ first-material layer 110 may be etched using the recipe of the first etchant used when the n–$d^{th}$ first-material layer 110 is etched. In other word, the process of etching the n–d–$1^{th}$ first-material layer 110 may be the substantially same as described with reference to FIG. 1C. (S400, S410, and S420).

If the first signal value is less than the second reference value, a gas ramping process (S310) may be implemented, i.e., at the time the n–d–$1^{th}$ first-material layer 110 is etched. In an example, the n–d–$1^{th}$ first-material layer 110 may be etched under a recipe different from the recipe under which the first etchant etches the n–$d^{th}$ first-material layer 110. (S310 and S320). For example, the amount of the first etchant used to etch of the n–d–$1^{th}$ first-material layer 110 may be greater than that of the first etchant used to etch the n–$d^{th}$ first-material layer 110, the injection time of the first etchant used to etch of the n–d–$1^{th}$ first-material layer 110 may be longer than that of the first etchant used to etch the n–$d^{th}$ first-material layer 110, or the ratio of the etching gas to the carrier gas in the first etchant used to etch of the n–d–$1^{th}$ first-material layer 110 may be greater than that in the first etchant used to etch the n–$d^{th}$ first-material layer 110. Etching the n–d–$1^{th}$ first-material layer 110 may be stopped after the first end point is detected using the first EPD signal (S330). The recipe of the first etchant may be stored.

The first etchant may be injected under the recipe used in each of the processes of etching the n–d–$1^{th}$ first-material layer 110 to the n–$k^{th}$ first-material layer 110, respectively. For example, the amount of the first etchant may be increased stepwise, the injection time of the first etchant may be increased stepwise, and/or the ratio of the etching gas to the carrier gas may be increased stepwise. The recipes of the first etchants injected from the n–d–$1^{th}$ first-material layer 110 to the n–$k^{th}$ first-material layer 110 may be stored, and a trend of the recipe of the first etchant with respect to the depth of the opening 140 may be discerned. In addition, a function of the recipe of the first etchant with respect to the depth of the opening 140 may be derived.

If the first signal value is less than the first reference value (S340) while the process describe above is being repeatedly performed, the gas ramping process may be terminated and the etching of the lower portion of the stack structure STK described with reference to FIG. 3 may be initiated. Recipes of the first and second etchants may be changed based on the functions of etch recipes used to etch the upper portion of the stack structure STK, and the first and second etchants are used under the new etch recipes to etch the first and second-material layers 110 and 120 of the lower portion of the stack structure STK.

FIGS. 7A to 7J illustrate a method of fabricating an example of a semiconductor device according to the inventive concepts. In the present example, the semiconductor device is a charge trap-type flash memory device. However, the inventive concepts may be applied to other types of semiconductor devices including other types of memory devices.

Figure 7A:
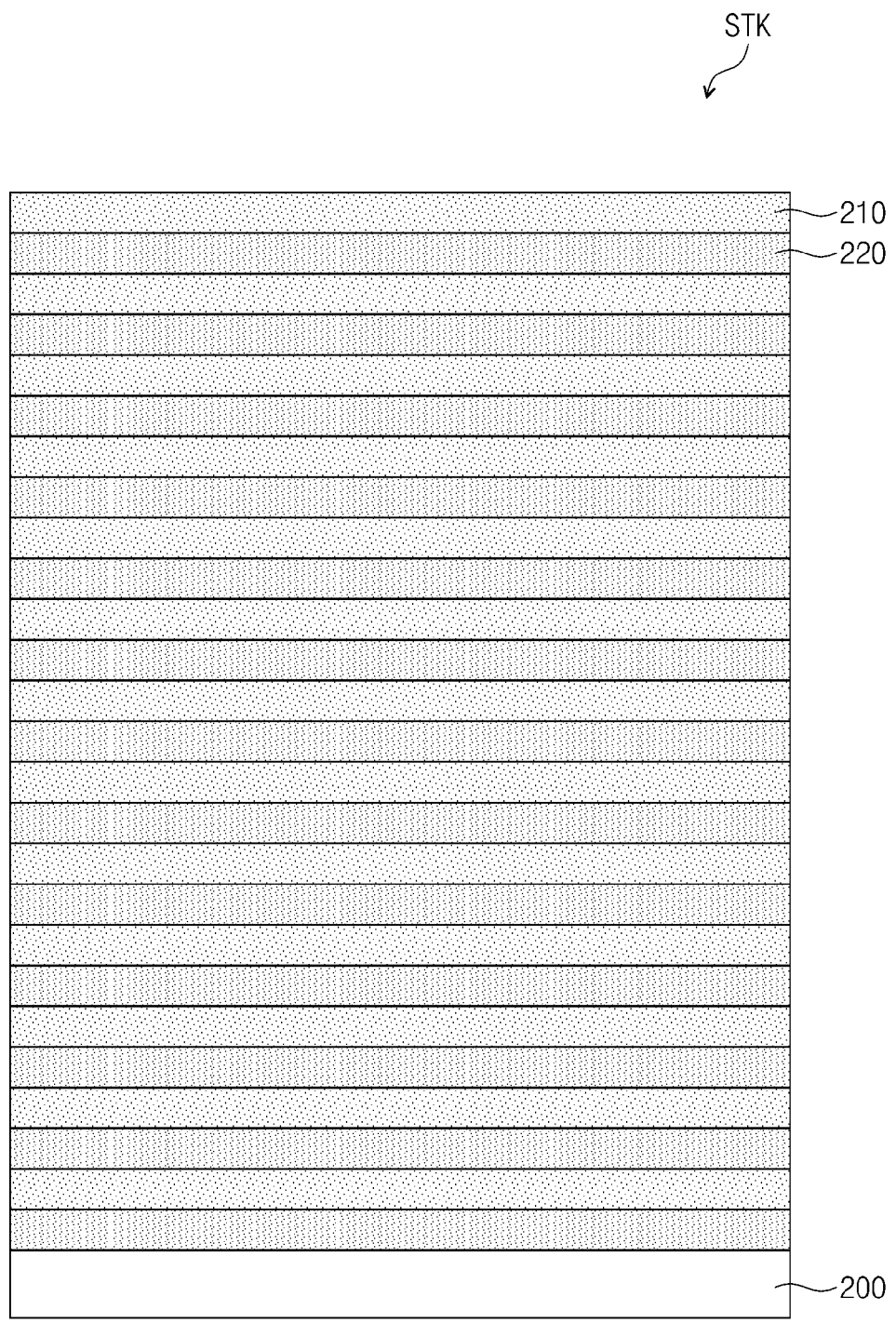
FIGS. 7A, 7B, 7C, 7D, 7E, 7F, 7G, 7H, 7I and 7J are cross-sectional views of a semiconductor device during the course of its manufacture and together illustrate an example a method of fabricating the semiconductor device according to the inventive concepts.

Referring to FIG. 7A, a stack structure STK may be formed on a substrate 200. The stack structure STK may include a plurality of insulating layers 210 and a plurality of sacrificial layers 220 which are alternately formed so that the insulating layers 210 and sacrificial layers 220 are stacked one on another.

Each of the insulating layers 210 may be a layer comprising silicon oxide, and each of the sacrificial layers 220 may be a layer comprising silicon nitride.

Figure 7B:
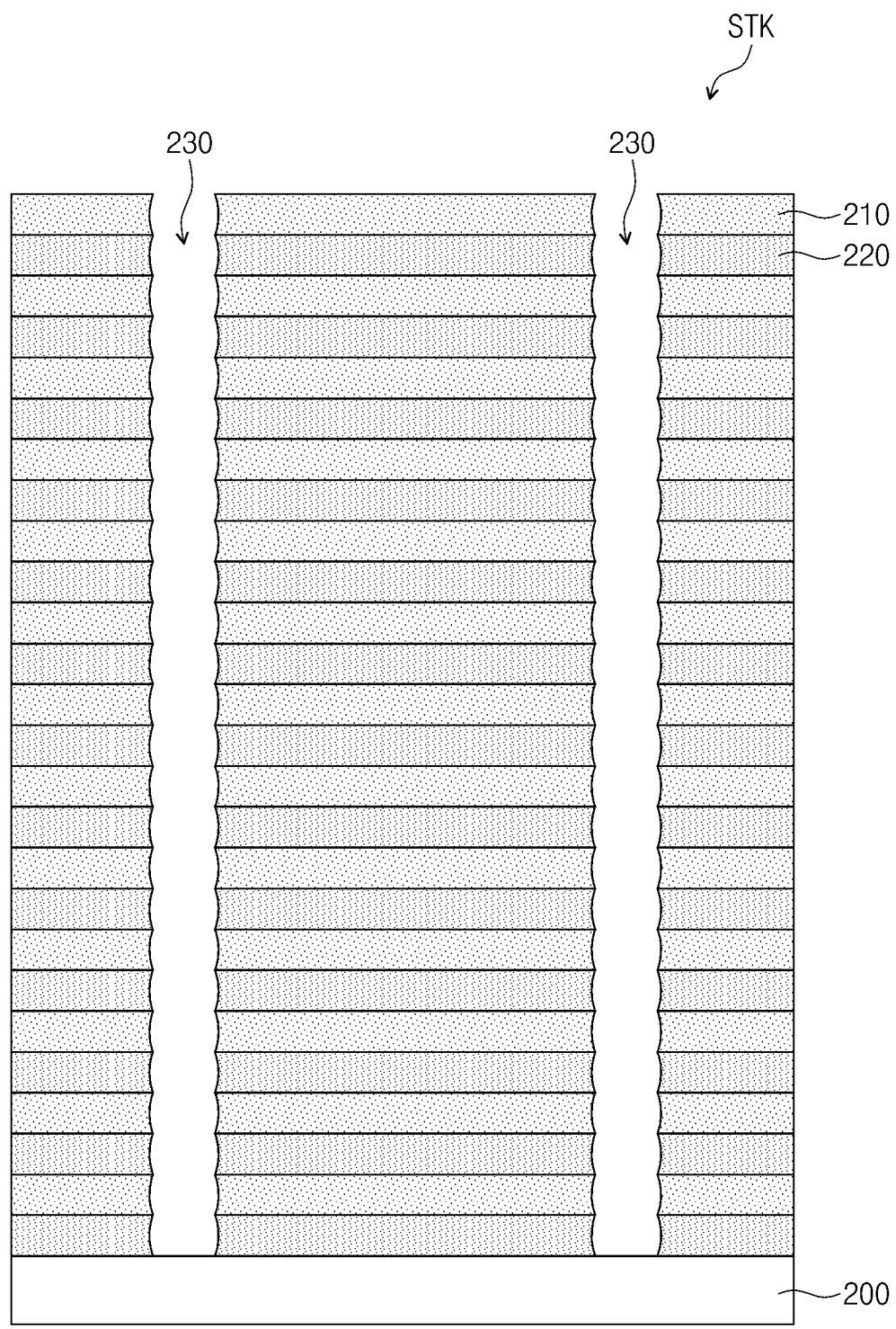

Referring to FIG. 7B, the insulating layers 210 and the sacrificial layers 220 of the stack structure STK may be etched to form a through-hole 230 penetrating the stack structure STK. The through-hole 230 may expose the substrate 200.

The etching process used to form the through-hole 230 may be performed using the process described with reference to FIGS. 1A to 1F and 2 to 4. The insulating layers 210 may correspond to the first-material layers 110 of FIGS. 1A to 1F, and the sacrificial layers 220 may correspond to the second-material layers 120 of FIGS. 1A to 1F.

As illustrated in FIG. 7B, an inner side surface of each of the insulating layers 210 and the sacrificial layers 220 exposed by the through hole 230 may be a concave surface.

Figure 7C:
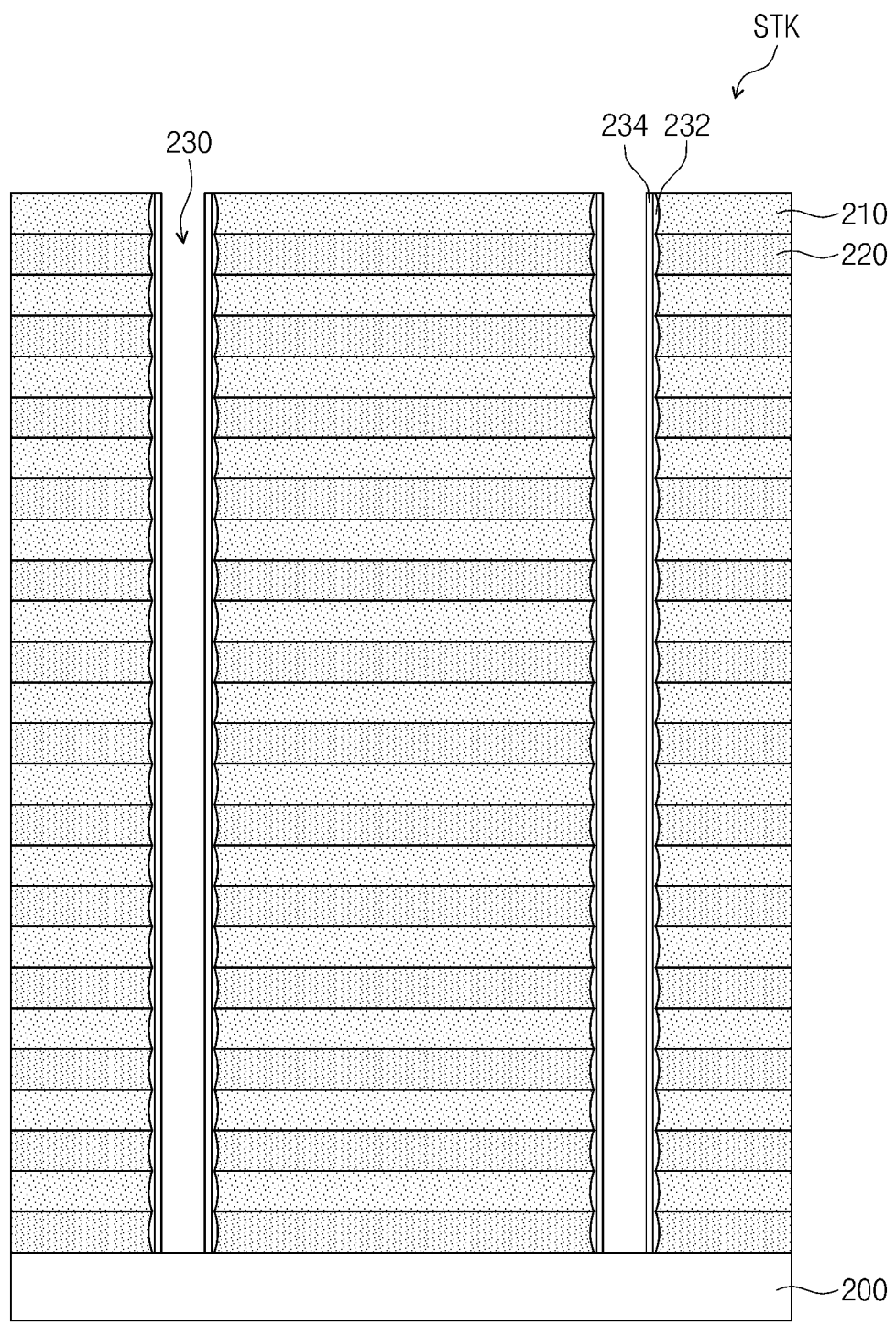

Referring to FIG. 7C, a charge storage layer 232 and a tunnel insulating layer 234 may be formed along an inner side surface of the stack structure delimiting the through hole 230. The charge storage layer 232 and the tunnel insulating layer 234 may not completely fill the through-hole 230.

The tunnel insulating layer 234 may include at least one material selected from the group whose energy band gaps are greater than that of the charge storage layer 232. For example, the tunnel insulating layer 234 may include at least one high-k dielectric material such as an aluminum oxide and hafnium oxide. Alternatively, the tunnel insulating layer 234 may be a silicon oxide layer. The charge storage layer 232 may include a trap-rich insulating layer (e.g., a silicon nitride layer), a floating gate electrode, or an insulating layer including conductive nano dots.

Figure 7D:
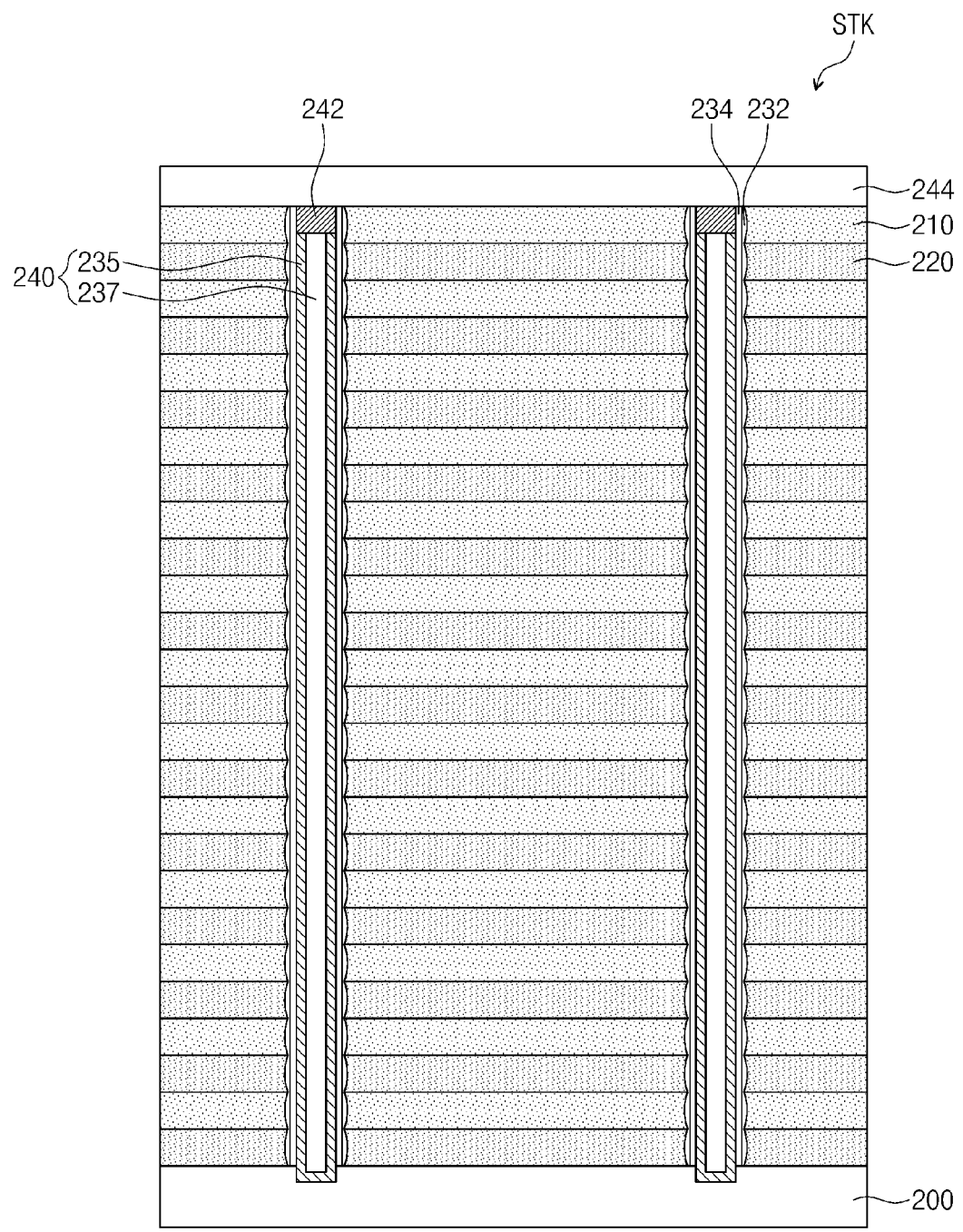

Referring to FIG. 7D, a vertical active pattern 240 and a conductive pad 242 may be formed by filling the through-hole 230 with a conductive material.

According to an example, forming the vertical active pattern 240 may include forming a semiconductor pattern 235 extending along the sides of the through hole 230 and connected to the substrate 200, and forming an insulating layer 237 filling the space left to the inside of the semiconductor pattern 235. The semiconductor pattern 235 may include silicon (Si), germanium (Ge), or a mixture thereof. The semiconductor pattern 235 may be doped or may be an intrinsic semiconductor (undoped). In addition, the semiconductor pattern 235 may have a crystal structure having at least one of a single-crystalline state, an amorphous state, or a poly-crystalline state. In an example, the vertical active pattern 240 may be hollow, i.e., may have the form of a pipe. In this case, a bottom end of the vertical active pattern 240 may be closed.

The conductive pad 242 may be formed on a top end of the vertical active pattern 240. The conductive pad 242 may be a doped region, i.e., may contain a dopant, or may be formed of a conductive material. A capping dielectric layer 244 may be formed to cover top surfaces of the vertical active pattern 240, the conductive pad 242, and the stack structure STK.

Figure 7E:
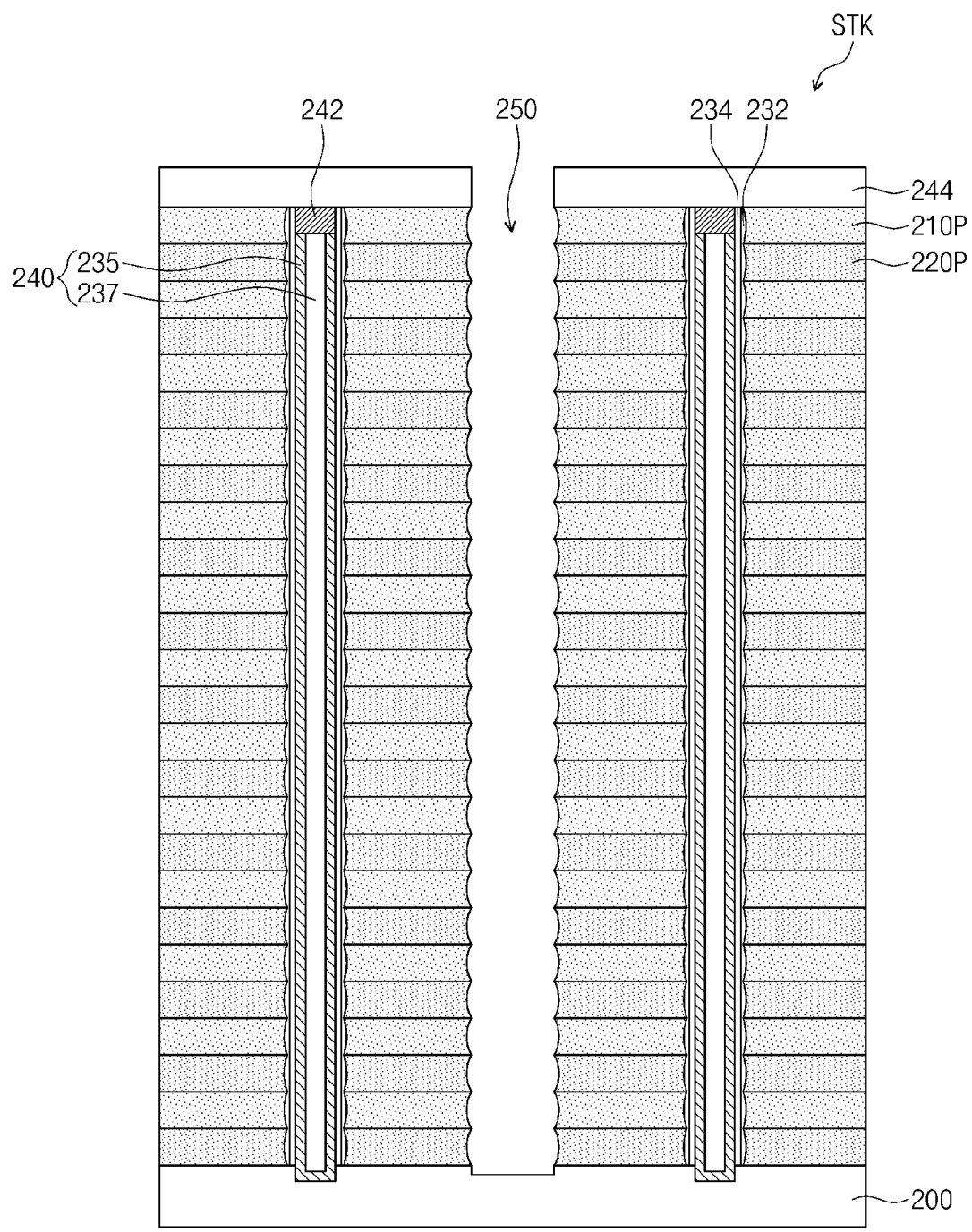

Referring to FIG. 7E, the stack structure STK may be etched to form a trench 250 extending longitudinally in one direction. As a result of the etching process, the insulating patterns 210P and sacrificial patterns 220P may be alternately formed along the vertical active pattern 240.

The etching process used to form the trench 250 may be performed using the process described with reference to FIGS. 1A through 1F and 2 through 4. The insulating patterns 210P may correspond to the first-patterns 110P of FIGS. 1A through 1F, and the sacrificial patterns 220P may correspond to the second-patterns 120P of FIGS. 1A through 1F.

As illustrated in FIG. 7E, an inner side surface of each of the insulating patterns 210P and the sacrificial patterns 220P exposed by the trench 250 may be a concave surface.

Figure 7F:
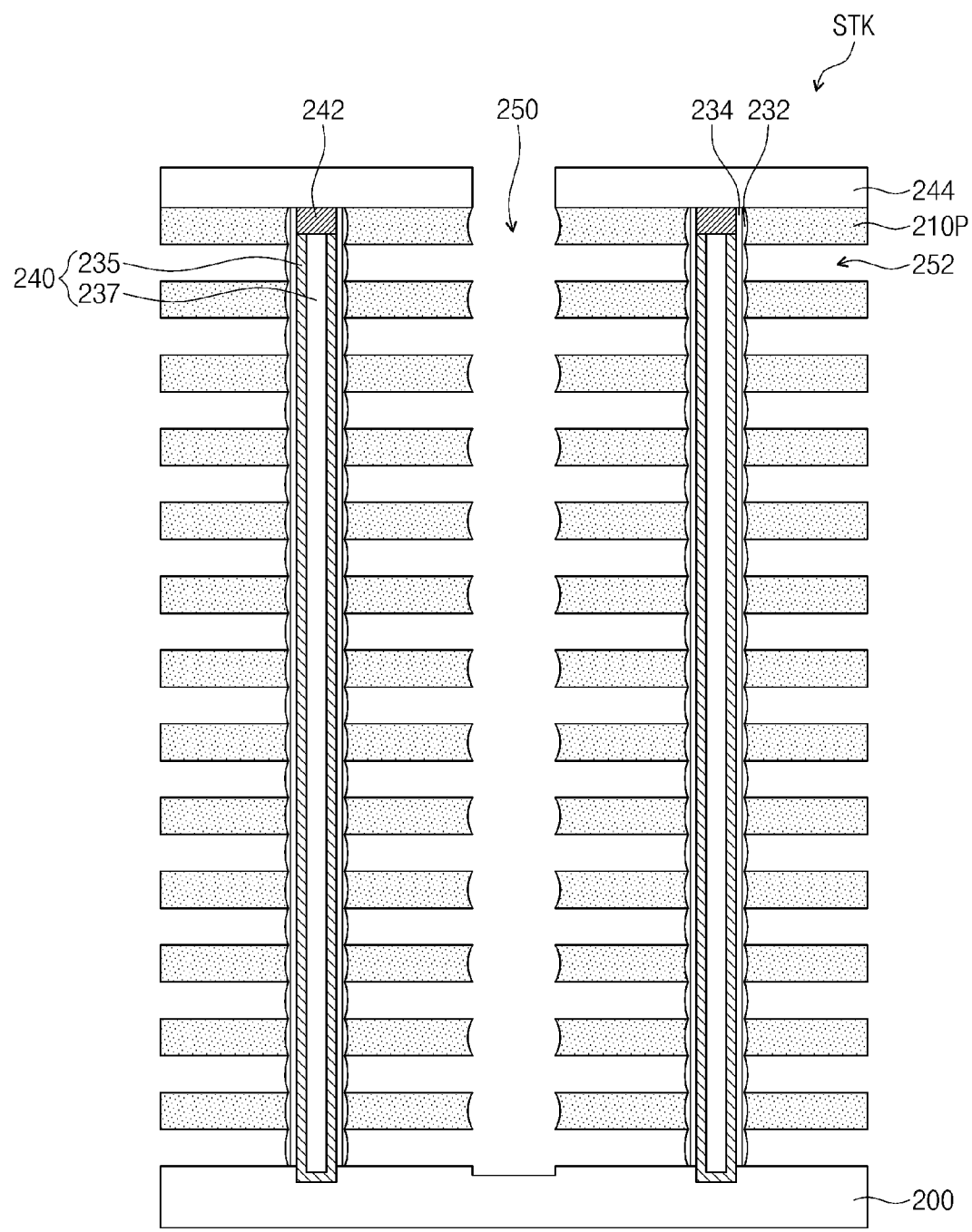

Referring to FIG. 7F, the sacrificial patterns 220P exposed by the trenches 250 may be removed to form recesses 252 between the insulating patterns 210P.

Figure 7G:
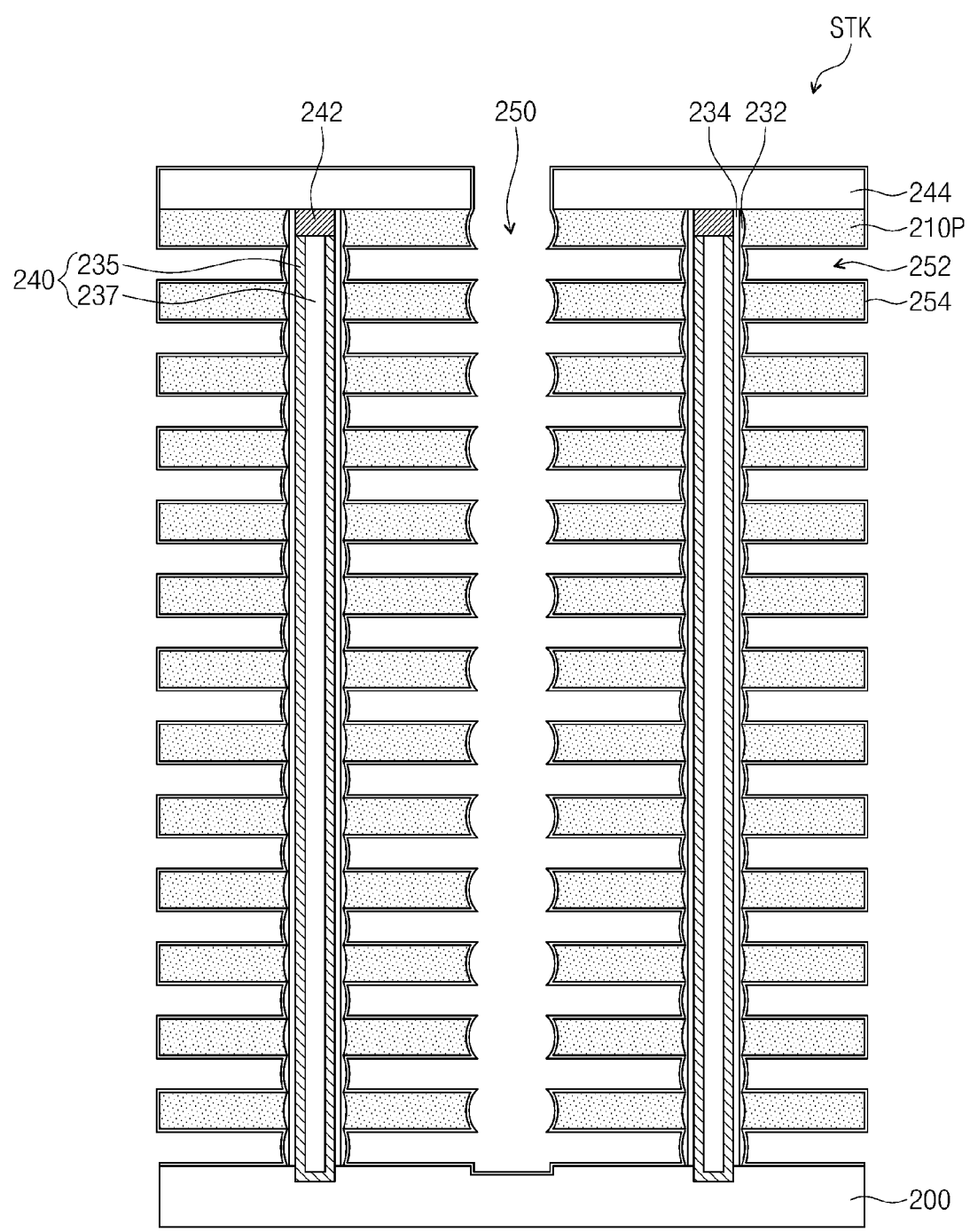

Referring to FIG. 7G, a blocking insulating layer 254 may be conformally formed in the recesses 252. The blocking insulating layer 254 may include at least one material selected from a group whose energy band gaps are smaller than that of the tunnel insulating layer 234 and greater than that of the charge storage layer 232. For example, the blocking insulating layer 254 may include at least one high-k dielectric layer such as an aluminum oxide layer and a hafnium oxide layer.

Figure 7H:
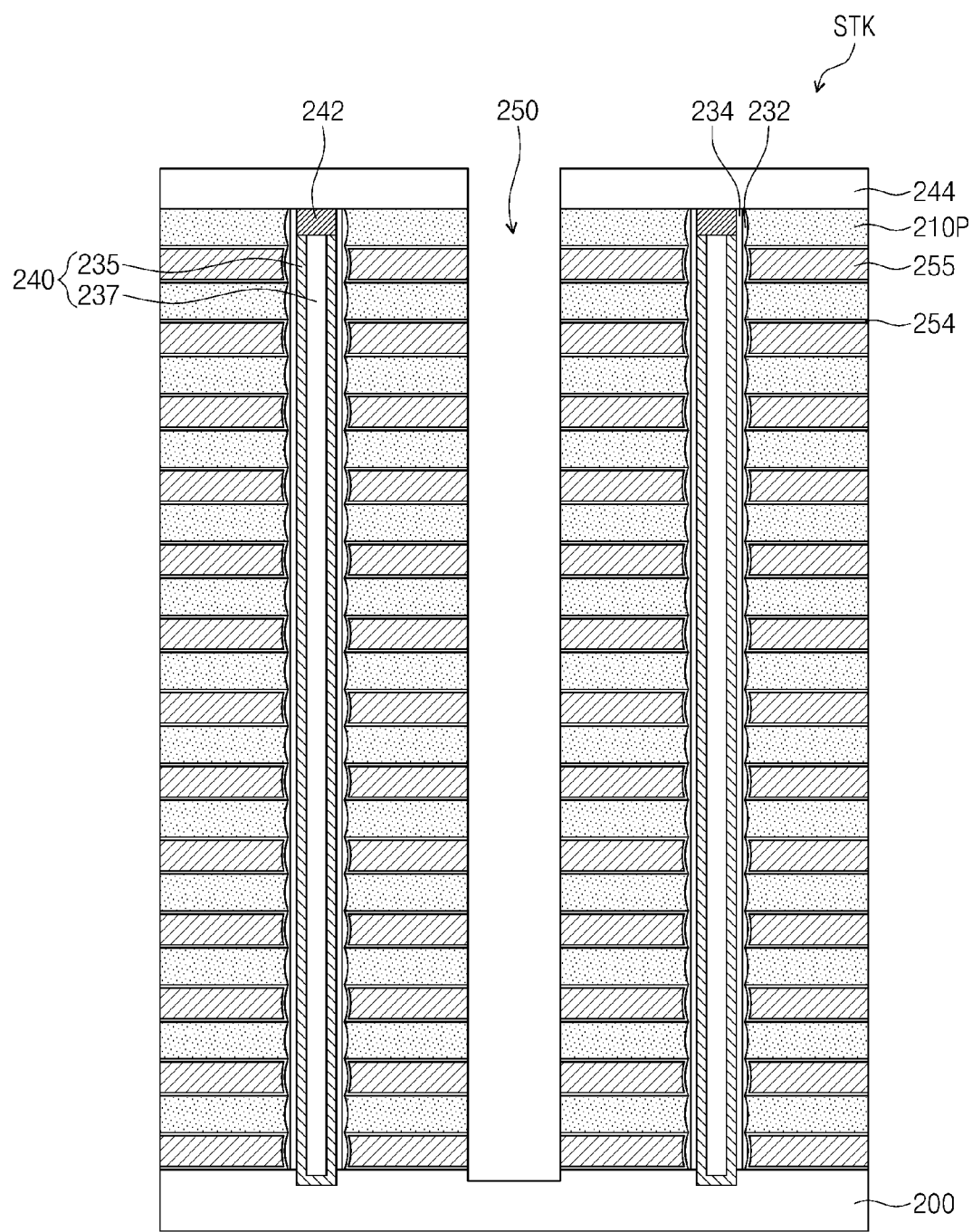

Referring to FIG. 7H, a gate pattern 255 may be formed to fill each of the recesses 252 in which the blocking insulating layer 254 is formed. The gate pattern 252 may include a barrier metal layer (not shown) and a metal layer (not shown) stacked on the barrier metal layer. The barrier metal layer may be formed of a metal nitride such as titanium nitride (TiN), tantalum nitride (TaN), or tungsten nitride (WN). The metal layer may be formed of at least one metal selected from the group consisting of tungsten (W), aluminum (Al), titanium (Ti), tantalum (Ta), cobalt (Co), and copper (Cu), for example.

According to an example, forming the gate pattern 255 includes sequentially forming the barrier metal layer and the metal layer which partially or completely fill the trench 250, and etching the barrier metal layer and the metal layer which remain in the trench 250. The surfaces of the structure defining the sides of the trench 250, which have an embossed shaped, may be etched by the process of etching the barrier metal layer and the metal layer so that the trench 250 may have substantially vertical sides.

Figure 7I:
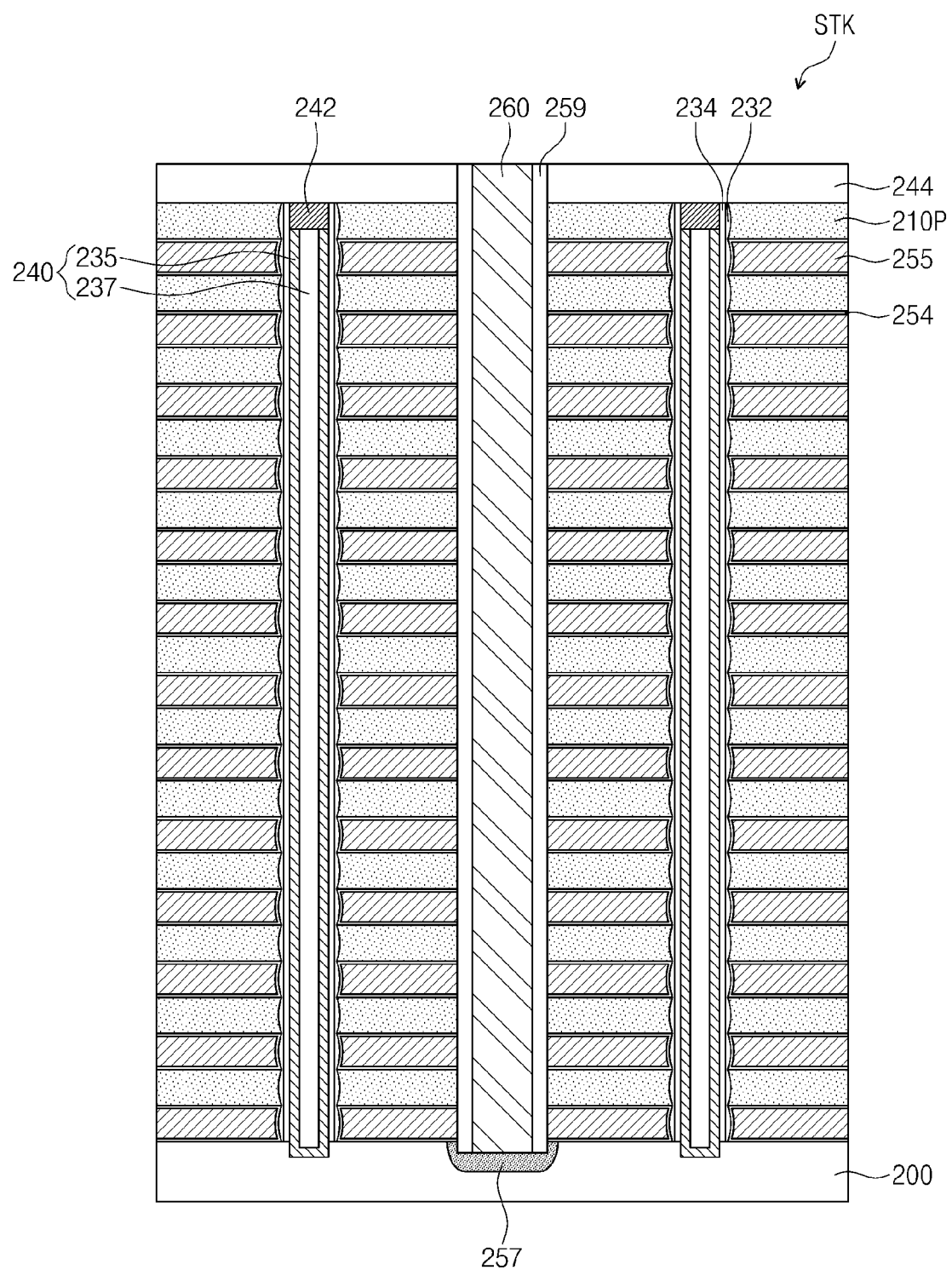

Referring to FIG. 7I, a common source region 257 may be formed in the substrate 200 exposed by the trench 250. The common source region 257 may be a region containing dopant of a conductivity type different from that of dopant of the substrate 200.

Next, a spacer 259 may be conformally formed on the side surfaces defining the sides of the trench 250, and a common source line 260 may be formed to fill the trench 250 having the spacers 259. The common source line 260 may be electrically connected to the common source region 257. The common source line 260 may include at least one of a metal (e.g., tungsten, copper, or aluminum), a conductive metal nitride (e.g., titanium nitride or tantalum nitride), or a transition metal (e.g., titanium or tantalum).

Figure 7J:
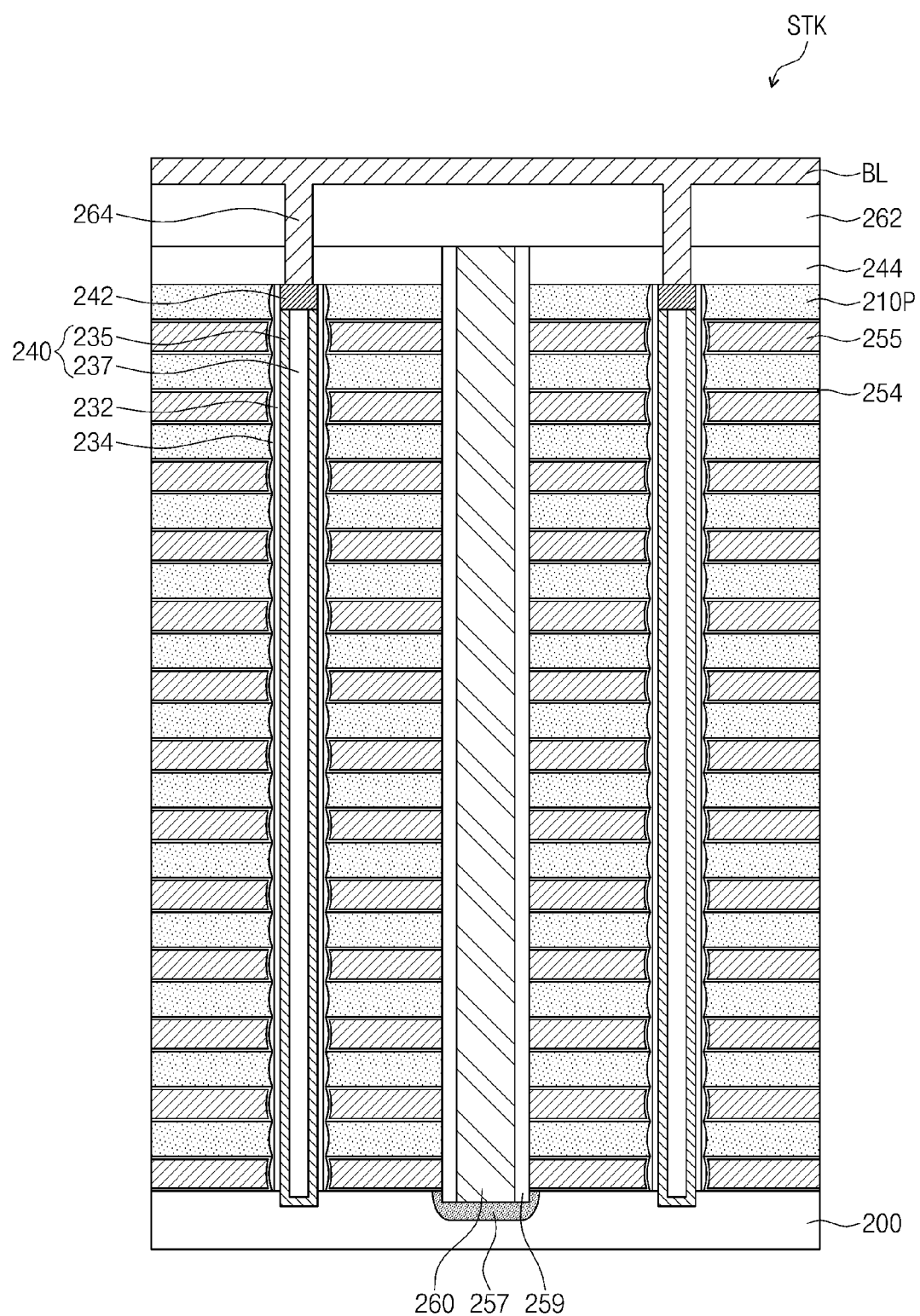

Referring to FIG. 7J, an interlayer insulating layer 262 may be formed on top surfaces of the common source line 260 and the vertical active pattern 240. A bit line plug 264 and a bit line BL may be formed. The bit line plug 264 may penetrate the interlayer insulating layer 262 and the capping dielectric layer 244 so as to be in contact with the vertical active pattern 240, and the bit line BL may be electrically connected to the bit line plug 264.

The bit line plug 264 and the bit line BL may include at least one of a metal (e.g., tungsten, copper, or aluminum), a conductive metal nitride (e.g., titanium nitride or tantalum nitride), or a transition metal (e.g., titanium or tantalum).

Figure 8:
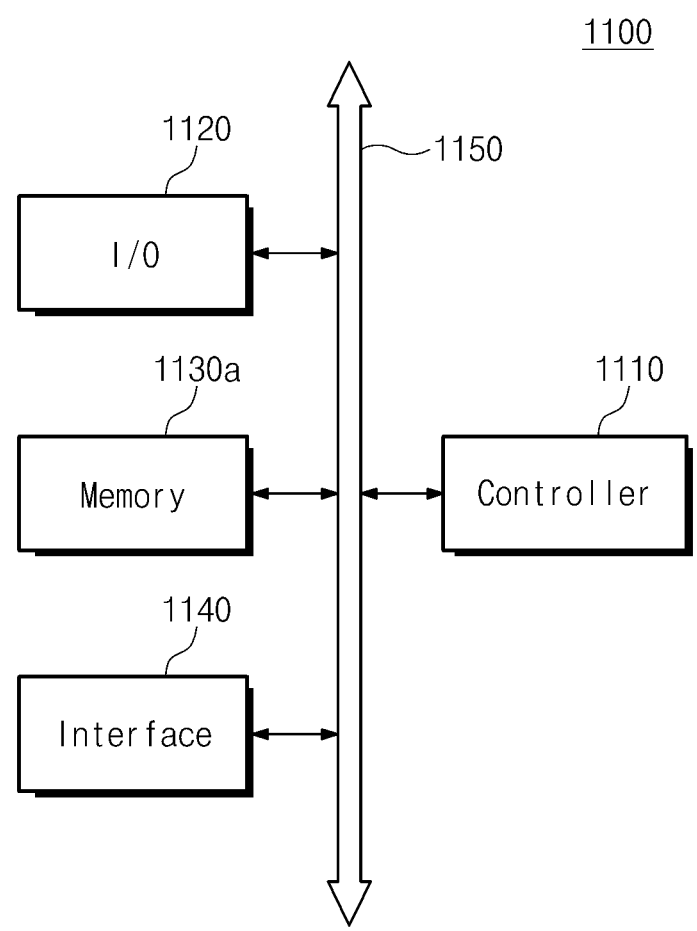
FIG. 8 is a schematic block diagram of an example of an electronic system including a semiconductor device fabricated according to the inventive concepts.

FIG. 8 illustrates an example of an electronic system including a semiconductor device fabricated according to the inventive concepts.

Referring to FIG. 8, an example of an electronic system 1100 according to the inventive concept includes a controller 1110, an input/output (I/O) unit 1120, a memory device 1130a, an interface unit 1140, and a data bus 1150. At least two of the controller 1110, the I/O unit 1120, the memory device 1130a, and the interface unit 1140 may communicate with each other through the data bus 1150. The data bus 1150 provides to a path through which electrical signals are transmitted. The controller 1110, the I/O unit 1120, the memory device 1130a, and/or the interface unit 1140 may include a semiconductor device fabricated according to the inventive concepts.

The controller 1110 may include at least one of a microprocessor, a digital signal processor, a microcontroller, or similar logic device. The I/O unit 1120 may include a keypad, a keyboard and/or a display device. The memory device 1130a may store data and/or commands. The interface unit 1140 may transmit electrical data to a communication network or may receive electrical data from a communication network. The interface unit 1140 may operate by wireless or cable. For example, the interface unit 1140 may include an antenna or a cable/wireless transceiver. Although not shown in the drawings, the electronic system 1100 may further include a fast dynamic random access memory (fast DRAM) device and/or a fast static random access memory (fast SRAM) device which acts as a working memory for improving an operation of the controller 1110.

The electronic system 1100 may be that employed by a personal digital assistant (PDA), a portable computer, a web tablet, a wireless phone, a mobile phone, a digital music player, a memory card, or any other electronic product receiving and/or transmitting data by wireless.

Figure 9:
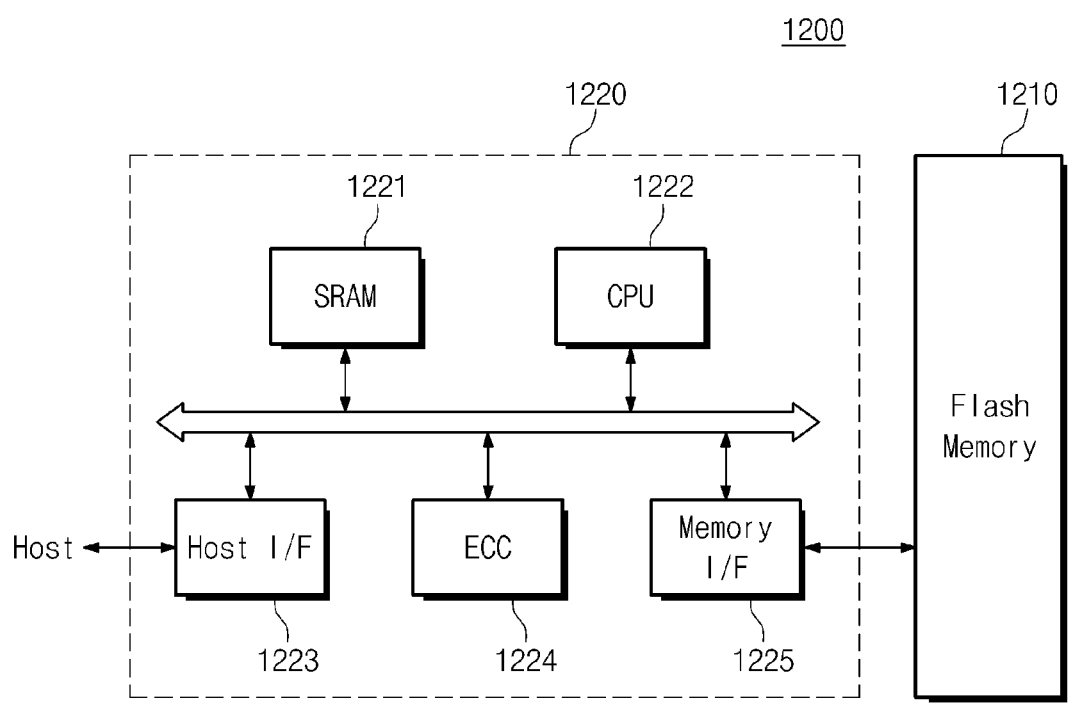
FIG. 9 is a schematic block diagram of an example of a memory card including a semiconductor device fabricated according to the inventive concepts.

FIG. 9 illustrates an example of a memory card including a semiconductor device fabricated according to the inventive concepts.

Referring to FIG. 9, this example of a memory card 1200 for storing massive amounts of data includes a flash memory device 1210 realized using a semiconductor device fabricated according to the inventive concepts. The memory card 1200 may include a memory controller 1220 that controls data communication between a host and the flash memory device 1210.

The memory controller 1220 may include a central processing unit (CPU) 1222 that controls overall operations of the memory card 1200. In addition, the memory controller 1220 may include an SRAM device 1221 used as a working memory of the CPU 1222. A host interface unit 1223 may be configured to include a data communication protocol between the memory card 1200 and the host. An error check and correction (ECC) block 1224 may detect and correct errors of data which are read out from the multi-bit flash memory device 1210. A memory interface unit 1225 may interface with the flash memory device 1210. Even though not shown in the drawings, the memory card 1200 may further include a read only memory (ROM) device that stores code to interface with the host.

As explained above, it can be difficult to etch a lower portion of a stack structure of first- and second-material layers in the manufacturing of certain types of semiconductor devices. However, according to examples of the inventive concepts, the functions of the injection times of the first and second etchants when etching the first- and second-material layers, respectively, may be obtained while an upper portion of the stack structure is etched, using EPD signals of the etching reaction gases. The etching of a lower portion of the stack structure may be facilitated using the functions of the injection times. Thus, obstacles in the etching of a relatively tall stack structure formed of a relatively great number of layers of different materials may be overcome.

In addition, the magnitudes of the EPD signals may be reduced as the process time of the process of etching the upper portion passes. In examples of the inventive concepts, the recipes of the first and second etchants may be changed by, for example, a gas ramping process, so that a problem associated with this phenomenon may be overcome.

Finally, examples of the inventive concepts have been described above in detail. The inventive concepts may, however, be put into practice in many different ways and should not be construed as being limited to the examples described above. Rather, these examples were described so that this disclosure is thorough and complete, and fully conveys the inventive concepts to those skilled in the art. Thus, the true spirit and scope of the inventive concepts is not limited by the examples described above but by the following claims.

What is claimed is:

1. A method of fabricating a semiconductor device, the method comprising:
    forming a stack structure including first-material layers and second-material layers alternately disposed one on another on a substrate, the first-material layers being etchable by etching gas of a first etchant, and the second-material layers being etchable by etching gas of a second etchant;
    forming a mask pattern on the stack structure;
    a first process of etching an upper portion the stack structure using the mask pattern as an etch mask to form an opening through the upper portion of the stack structure,
    wherein the first process comprises etching respective ones of the first- and second-material layers with the first and second etchants, respectively, generating end point detection (EPD) signals by monitoring first and second etching reaction gases resulting from the etching of said respective ones of the first- and second-material layers, determining end points of the etching of said respective ones of the first- and second-material layers with the first and second etchants from the end point detection (EPD) signals, and using the end points to discern a first set of etch recipes under which said respective ones of the first- and second-material layers have been etched;
    deriving first and second functions of injection times of the first and second etchants, respectively, each with respect to a depth of the opening during the first process; and
    a second process of etching a lower portion of the stack structure using the mask pattern as an etch mask to extend the opening in the upper portion of the stack structure through the lower portion of the stack structure and thereby expose the substrate,
    wherein the second process comprises creating a second set of etch recipes based on the first and second functions of injection times of the first and second etchants, respectively, and etching respective ones of the first- and second-material layers in the lower portion of the stack structure under the second set of etch recipes,
    whereby the etch recipes of the first set under which the first- and second-material layers of the upper portion of the stack structure are etched are respectively different from the etch recipes of the second set under which the first and second-material layers of the lower portion of the stack structure are etched,
    wherein the first process comprises
    injecting the first etchant into a process chamber to etch a $n^{th}$ first-material layer of the stack structure;
    generating a first EPD signal from the first etching reaction gas as the $n^{th}$ first-material layer is etched by the first etchant;
    comparing a value of the first EPD signal with a first reference value;
    stopping the injecting of the first etchant when the value of the first EPD signal is greater than the first reference value, and discerning a $n^{th}$ etch recipe of the first set of etch recipes under which the $n^{th}$ first-material layer was etched using the first etchant up until a time the injecting of the first etchant was stopped;
    storing the $n^{th}$ etch recipe under which the $n^{th}$ first-material layer was etched, in a readable memory;
    injecting the second etchant into the process chamber to etch a $m^{th}$ second-material layer of the stack structure;
    generating a second EPD signal from the second etching reaction gas as the $m^{th}$ second-material layer is etched by the second etchant;
    comparing a value of the second EPD signal with the first reference value;
    stopping the injecting of the second etchant when the value of the second EPD signal is greater than the first reference value, and discerning a $m^{th}$ etch recipe of the first set of etch recipes under which the $m^{th}$ first-material layer was etched using the second etchant up until a time the injecting of the second etchant was stopped; and storing the $m^{th}$ etch recipe under which the $m^{th}$ first-material layer was etched, in the readable memory, wherein the first process is terminated when at least one of the values of the first and second EPD signals is less than the first reference value.

2. The method of claim 1, wherein the value of the first EPD signal is a difference between a magnitude of a start point of the first EPD signal and a magnitude of a peak of the first EPD signal, and the value of the second EPD signal is a difference between a magnitude of a start point of the second EPD signal and a magnitude of a peak of the second EPD signal.

3. The method of claim 1, wherein the second process comprises:

injecting the first etchant into the process chamber under an etch recipe of the second set of etch recipes based on the first function to etch an $(n-k)^{th}$ one of the first-material layers, and stopping the injecting of the first etchant injected to etch the $(n-k)^{th}$ one of the first-material layers at a time determined by the first function, and injecting the second etchant into the process chamber under an etch recipe of the second set based on the second function to etch an $(m-k)^{th}$ one of the second-material layers, and stopping the injecting of the second etchant injected to etch the $(m-k)^{th}$ one of the second-material layers at a time determined by the second function.

4. The method of claim 1, further comprising:

deriving functions of amounts of the first and second etchants injected into the process chamber with respect to the depth of the opening during the first process; and deriving functions of amounts of the etching gases in the first and second etchants with respect to the depth of the opening during the first process.

5. A method of fabricating a semiconductor device, the method comprising:

forming a stack structure including first-material layers and second-material layers alternately stacked on a substrate, the first-material layers being etchable by a first etchant, and the second-material layers being etchable by a second etchant;

forming a mask pattern on the stack structure;

etching an upper portion of the stack structure using the mask pattern as an etch mask by a first process to form an opening;

etching an intermediate portion of the stack structure using the mask pattern as an etch mask by a second process to extend the opening; and etching a lower portion of the stack structure using the mask pattern as an etch mask by a third process to further extend the opening to such an extent that the opening exposes the substrate, wherein, in each of the first and second processes, recipes of the first and second etchants are changed using first and second end point detection (EPD) signals representative of amounts of first and second etching reaction gases produced as a result of the first and second processes, respectively, to etch first and second-material layers of each of the upper and intermediate portions, wherein functions of the recipes of the first and second etchants with respect to the depth of the opening are obtained during the first and second processes, wherein, in the third process, the recipes of the first and second etchants are changed using the functions obtained during the first and second processes to etch the first and second-material layers of the lower portion, wherein the first process comprises injecting the first etchant into a process chamber to etch a $n^{th}$ one of the first-material layers;

comparing a value of the first EPD signal, produced as a result of the etching of the $n^{th}$ one of the first-material layers, with a first reference value;

stopping the injecting of the first etchant when the value of the first EPD signal is greater than the first reference value;

storing the recipe of the first etchant injected to etch the $n^{th}$ one of the first-material layers;

injecting the second etchant into the process chamber to etch a $m^{th}$ one of the second-material layers;

comparing a value of the second EPD signal, produced as a result of the etching of the $m^{th}$ one of the second-material layers, with the first reference value;

stopping the injecting of the second etchant when the value of the second EPD signal is greater than the first reference value; and storing the recipe of the second etchant injected to etch the $m^{th}$ one of the second-material layers;

wherein the second process comprises injecting the first etchant into the process chamber to etch an $(n-d)^{th}$ one of the first-material layers;

comparing a value of the first EPD signal, representative of an amount of the first etching reaction gas produced by the etching of the $(n-d)^{th}$ one of the first-material layers, with a second reference value when the value of the first EPD signal corresponding to the $(n-d)^{th}$ first-material layer is greater than the first reference value;

stopping the injecting of the first etchant injected to etch the $(n-d)^{th}$ one of the first-material layers and storing the recipe of the first etchant injected to etch the $(n-d)^{th}$ one of the first-material layers when the value of said first EPD signal, representative of the amount of first etching reaction gas produced by the etching of the $(n-d)^{th}$ one of the first-material layers, is less than the second reference value;

changing the recipe of the first etchant used to etch the $(n-d)^{th}$ one of the first-material layers;

injecting the second etchant into the process chamber to etch an $(m-d)^{th}$ one of the second-material layers;

comparing a value of the second EPD signal, representative of an amount of the second etching reaction gas produced by the etching of the $(m-d)^{th}$ one of the second-material layers, with the second reference value when said value of the second EPD signal corresponding to the $(m-d)^{th}$ second-material layer is greater than the first reference value;

stopping the injecting of the second etchant injected to etch the $(m-d)^{th}$ one of the second-material layers and storing the recipe of the second etchant injected to etch the $(m-d)^{th}$ one of the second-material layers when the second EPD signal, representative of the amount of second etching reaction gas produced by the etching of the $(m-d)^{th}$ one of the second-material layers, is less than the second reference value;

changing the recipe of the second etchant used to etch the $(m-d)^{th}$ one of the second-material layers;

etching an $(n-d-1)^{th}$ one of the first-material layers using the changed recipe of the first etchant; and etching an (m−d−1)$^{th}$ one of the second-material layers using the changed recipe of the second etchant, wherein, when at least one of the values of the first and second EPD signals is less than the first reference value, the second process is terminated and the third process is initiated.

6. The method of claim 5, wherein the recipes of the first and second etchants include at least one of an injection time of each of the first and second etchants, an injection amount of each of the first and second etchants, and a ratio of an etching gas to a carrier gas in each of the first and second etchants.

7. The method of claim 5, wherein the third process comprises:

injecting the first etchant into the process chamber based on the functions obtained in the first and second processes to etch an (n−k)$^{th}$ one of first-material layers;

stopping the injecting of the first etchant injected to etch the (n−k)$^{th}$ one of first-material layers based on a recipe determined by the functions;

injecting the second etchant into the process chamber based on the functions obtained in the first and second processes to etch an (m−k)$^{th}$ one of the second-material layers; and stopping the injecting of the second etchant injected to etch the (m−k)$^{th}$ one of second-material layers based on a recipe determined by the functions.

8. A method of fabricating a semiconductor device, the method comprising:

forming a stack structure including first-material layers and second-material layers alternately disposed one on another on a substrate, the first-material layers being etchable by etching gas of a first etchant, and the second-material layers being etchable by etching gas of a second etchant;

forming a mask pattern on the stack structure;

a first process of etching an upper portion of the stack structure using the mask pattern as an etch mask to form an opening through the upper portion of the stack structure, wherein the first process comprises etching respective ones of the first- and second-material layers with the first and second etchants, respectively, generating end point detection (EPD) signals by monitoring first and second etching reaction gases resulting from the etching of said respective ones of the first- and second-material layers, determining end points of the etching of said respective ones of the first- and second-material layers with the first and second etchants from the end point detection (EPD) signals, and using the end points to discern a first set of etch recipes under which said respective ones of the first- and second-material layers have been etched;

deriving first and second functions of injection times of the first and second etchants, respectively, each with respect to a depth of the opening during the first process; and a second process of etching a lower portion of the stack structure using the mask pattern as an etch mask to extend the opening in the upper portion of the stack structure through the lower portion of the stack structure and thereby expose the substrate, wherein the second process comprises creating a second set of etch recipes based on the first and second functions of injection times of the first and second etchants, respectively, and etching respective ones of the first- and second-material layers in the lower portion of the stack structure under the second set of etch recipes, whereby the etch recipes of the first set under which the first- and second-material layers of the upper portion of the stack structure are etched are respectively different from the etch recipes of the second set under which the first and second-material layers of the lower portion of the stack structure are etched, wherein the first process comprises injecting the first etchant into a process chamber to etch an (n−d)$^{th}$ one of the first-material layers;

comparing a value of a first EPD signal of the EPD signals generated during the etching of the (n−d)$^{th}$ one of the first-material layers with a second reference value when said value of the first EPD signal is greater than a first reference value;

stopping the injecting of the first etchant and storing an etch recipe under which the first etchant was injected when the value of the first EPD signal is less than the second reference value;

creating a new etch recipe from the etch recipe under which the first etchant was used to etch the (n−d)$^{th}$ one of the first-material layers; and etching an (n−d−1)$^{th}$ one of the first-material layers under the new etch recipe, wherein the (n−d−1)$^{th}$ one of the first-material layers is etched using a same etch recipe under which the (n−d)$^{th}$ one of the first-material layers was etched when said value of the first EPD signal generated during the etching of (n−d)$^{th}$ one of the first-material layers is greater than the second reference value.

9. The method of claim 8, wherein each of the etch recipes of the first set under which the first and second etchants are used to etch respective ones of the first and second-material layers, respectively, of the upper portion of the stack structure includes at least one of an amount of the first and second etchants used to etch a respective one of the first- and second-material layers up until the end point of the etching of the respective material layer has been determined, a time during which the first and second etchants used to etch a respective one of the material layers has been injected up until the end point of the etching of the respective material layer has been determined, and a ratio between the etching gas and a carrier gas of the first and second etchants used to etch a respective one of the material layers.

10. The method of claim 8, wherein the second process comprises:

injecting the first etchant into the process chamber under an etch recipe of the second set based on the first function to etch an (n−k)$^{th}$ one of the first-material layers, and stopping the injecting of the first etchant injected to etch the (n−k)$^{th}$ one of the first-material layers at a time determined by the first function, and injecting the second etchant into the process chamber under an etch recipe of the second set based on the second function to etch an (m−k)$^{th}$ one of the second-material layers, and stopping the injecting of the second etchant injected to etch the (m−k)$^{th}$ one of the second-material layers at a time determined by the second function.

11. The method of claim 8, further comprising:

deriving functions of amounts of the first and second etchants injected into the process chamber with respect to the depth of the opening during the first process; and deriving functions of amounts of the etching gases in the first and second etchants with respect to the depth of the opening during the first process.

* * * * *